United States Patent
Lee et al.

(10) Patent No.: US 8,827,536 B2
(45) Date of Patent: Sep. 9, 2014

(54) DISPLAY DEVICE

(71) Applicants: Gun-Hwan Lee, Suwon-si (KR);
Jung-Heum Yun, Gimhae-si (KR);
Sung-Hun Lee, Changwon-si (KR)

(72) Inventors: Gun-Hwan Lee, Suwon-si (KR);
Jung-Heum Yun, Gimhae-si (KR);
Sung-Hun Lee, Changwon-si (KR)

(73) Assignee: Korea Institute of Machinery & Materials, Daejeon (KR)

( * ) Notice: Subject to any disclaimer, the term of this patent is extended or adjusted under 35 U.S.C. 154(b) by 3 days.

(21) Appl. No.: 13/820,053

(22) PCT Filed: Feb. 22, 2013

(86) PCT No.: PCT/KR2013/001458
§ 371 (c)(1),
(2), (4) Date: Feb. 28, 2013

(87) PCT Pub. No.: WO2014/021531
PCT Pub. Date: Feb. 6, 2014

(65) Prior Publication Data
US 2014/0126228 A1    May 8, 2014

(51) Int. Cl.
| | |
|---|---|
| *F21V 8/00* | (2006.01) |
| *G09F 13/22* | (2006.01) |
| *G09F 9/00* | (2006.01) |
| *F21V 21/00* | (2006.01) |
| *H04M 1/02* | (2006.01) |

(52) U.S. Cl.
CPC .............. *F21V 21/00* (2013.01); *H04M 1/0268* (2013.01); *G09F 13/22* (2013.01); *G09F 9/00* (2013.01); *H04M 1/0283* (2013.01)

USPC .................. 362/633; 362/249.04; 362/249.08

(58) Field of Classification Search
CPC ... F21V 17/16; F21V 17/101; G02B 6/00045; G02B 6/0088
USPC ........ 362/633, 632, 634, 249.04, 249.08, 278
See application file for complete search history.

(56) References Cited

U.S. PATENT DOCUMENTS

2009/0073084 A1*  3/2009  Mullen .............................. 345/8

FOREIGN PATENT DOCUMENTS

| JP | 10-111517 A | 4/1998 |
|---|---|---|
| JP | 2010-271552 A | 12/2010 |
| JP | 2012-073293 A | 4/2012 |
| JP | 2012-128006 A | 7/2012 |
| KR | 10-2010-0046478 A | 5/2010 |
| KR | 10-2011-0068169 A | 6/2011 |
| KR | 10-2012-0053678 A | 5/2012 |
| KR | 10-2012-0067208 A | 6/2012 |
| KR | 10-2012-0077471 A | 7/2012 |

* cited by examiner

*Primary Examiner* — Sharon Payne
(74) *Attorney, Agent, or Firm* — Harness, Dickey & Pierce, P.L.C.

(57) ABSTRACT

In one embodiment, the display device includes a display panel and a support frame. The display panel includes a flexible upper substrate, at least one light emitting diode, and a flexible lower substrate (30). The display panel has a display area formed at a portion corresponding to the light emitting diode, and a non-display area formed at a portion other than the display area. The display panel is coupled to the support frame such that a portion of the non-display area is bent with respect to the display area.

20 Claims, 19 Drawing Sheets

DISPLAY DEVICE

CROSS-REFERENCE TO RELATED APPLICATIONS

This is a National Phase of PCT/KR2013/001458 filed Feb. 22, 2013, and claims priority under 35 U.S.C. §120 to Korean Patent Application number 10-2012-0083815, filed Jul. 31, 2012, the entire contents of each of which are hereby incorporated by reference.

BACKGROUND

1. Technical Field

Some example embodiments relate to display devices, and more particularly, to display devices which have an expanded display area.

2. Related Art

Recently, there have been many advances in the display field to keep up with the information age. Accordingly, liquid crystal display (LCD) devices, plasma display panel (PDP) devices, electroluminescent display (ELD) devices, field emission display (FED) devices, etc. have been proposed as examples of flat panel display (FPD) devices which have advantages of being thinner and lighter and consuming less power. Such FPDs are rapidly replacing existing cathode ray tubes (CRTs) and are presently in the limelight.

However, regardless of the kind of display devices, the existing display devices inevitably include an opaque area. For example, the opaque areas include a sealing line bonding a pair of substrates together and sealing a space therebetween, and also include wiring extending from a display area (e.g., an emitting layer). Therefore, a non-display area known as a bezel area is inevitably formed at a front surface of the display device.

FIG. 19 is a schematic view of a display device using a conventional display panel. As shown in FIG. 19, when the conventional display panel is used, non-display areas are formed at a plurality of portions of the display device. In detail, non-display areas (BA) are formed at a perimeter of a front surface of the display device and left, right, upper and lower side surfaces of the display device.

In the event that the width of a sealing line formed at a perimeter of a display area is reduced to minimize the non-display areas, an adhesive force may be reduced, thereby causing a separation phenomenon. This may increase a defective product rate and reduces product competitiveness. Further, although this method can reduce the bezel area, there exists a limit in that the method cannot completely remove the bezel area from the front surface of the display device.

SUMMARY

At least one embodiment provides solutions to the above problems of the conventional display devices. In particular, at least one example embodiment provides a display device which can minimize or eliminate a non-display area at a front surface of the display device, or expand a display area to side surfaces of the display device.

According to one example embodiment, a display device includes a display panel, which has a flexible upper substrate, at least one light emitting diode, and a flexible lower substrate, and a support frame coupled to the display panel. The display panel includes a display area formed at a portion corresponding to the at least one light emitting diode, and a non-display area formed at a portion other than the display area. The display panel is coupled to the support frame such that a portion of the non-display area is bent with respect to the display area.

According to another example embodiment, a display includes a display panel, which has a flexible upper substrate, at least one light emitting diode, and a flexible lower substrate, and a support frame provided under and supporting the display panel. The display panel includes a display area formed on a portion corresponding to the at least one light emitting diode, and a non-display area formed on a portion other than the display area. The display panel is coupled to the support frame such that a portion of the non-display area is bent towards the support frame.

According to still another example embodiment, the display further includes a display area of the display panel, at least a portion of which is formed to have a bent portion. The bent portion of the display area may be bent, e.g., approximately perpendicular, to a remaining non-bent portion of the display area such that the display area may be formed both at a front surface of the display panel and at side surfaces thereof.

According to some example embodiments, a display area may be provided not only at a front surface of the display device, but also at left and/or right side surfaces thereof. Therefore, the example embodiments can provide a relatively large display area compared to the conventional display device.

Furthermore, the example embodiments can reduce or eliminate an opaque area (in other words, a bezel area) of the display device, which has been inevitably formed at the perimeter of the front surface of the conventional display device, thus providing a relatively large display area compared to the conventional display device.

BRIEF DESCRIPTION OF THE DRAWINGS

Example embodiments will be more clearly understood from the following brief description taken in conjunction with the accompanying drawings.

FIG. 1 is an exploded perspective view illustrating a display device according to a first example embodiment FIG. 2 is an assembled cross-sectional view taken along a line II-II' of FIG. 1;

FIG. 3 is an assembled cross-sectional view illustrating a display device according to a second example embodiment;

FIG. 4 is an exploded perspective view illustrating a display device according to a third example embodiment;

FIG. 5 is an assembled cross-sectional view taken along a line V-V' of FIG. 4;

FIG. 6 is an assembled cross-sectional view illustrating a display device according to a fourth example embodiment;

FIG. 7 is an exploded perspective view illustrating a display according to a fifth example embodiment;

FIG. 8 is an assembled cross-sectional view taken along a line VIII-VIII' of FIG. 7;

FIG. 9 is an exploded perspective view illustrating a display device according to a sixth example;

FIG. 10 is an assembled cross-sectional view taken along a line X-X' of FIG. 9;

FIG. 11 is an exploded perspective view illustrating a display device according to a seventh example embodiment;

FIG. 12 is an assembled cross-sectional view taken along a line XII-XII' of FIG. 11;

FIG. 13 is a plan view of a display panel when it is not in a bent state according to an eighth example embodiment;

FIG. 14 is an exploded perspective view illustrating a display device provided with the display panel of FIG. 13;

FIG. 15 is a plan view of a display panel when it is not in a bent state according to a ninth example embodiment;

FIG. 16 is an exploded perspective view illustrating a display device using the display panel of FIG. 15;

FIGS. 17 and 18 are schematic views illustrating display devices using display panels according to example embodiments; and FIG. 19 is a schematic view illustrating a display device provided with a conventional display panel.

DETAILED DESCRIPTION OF EXAMPLE EMBODIMENTS

Figure 1:
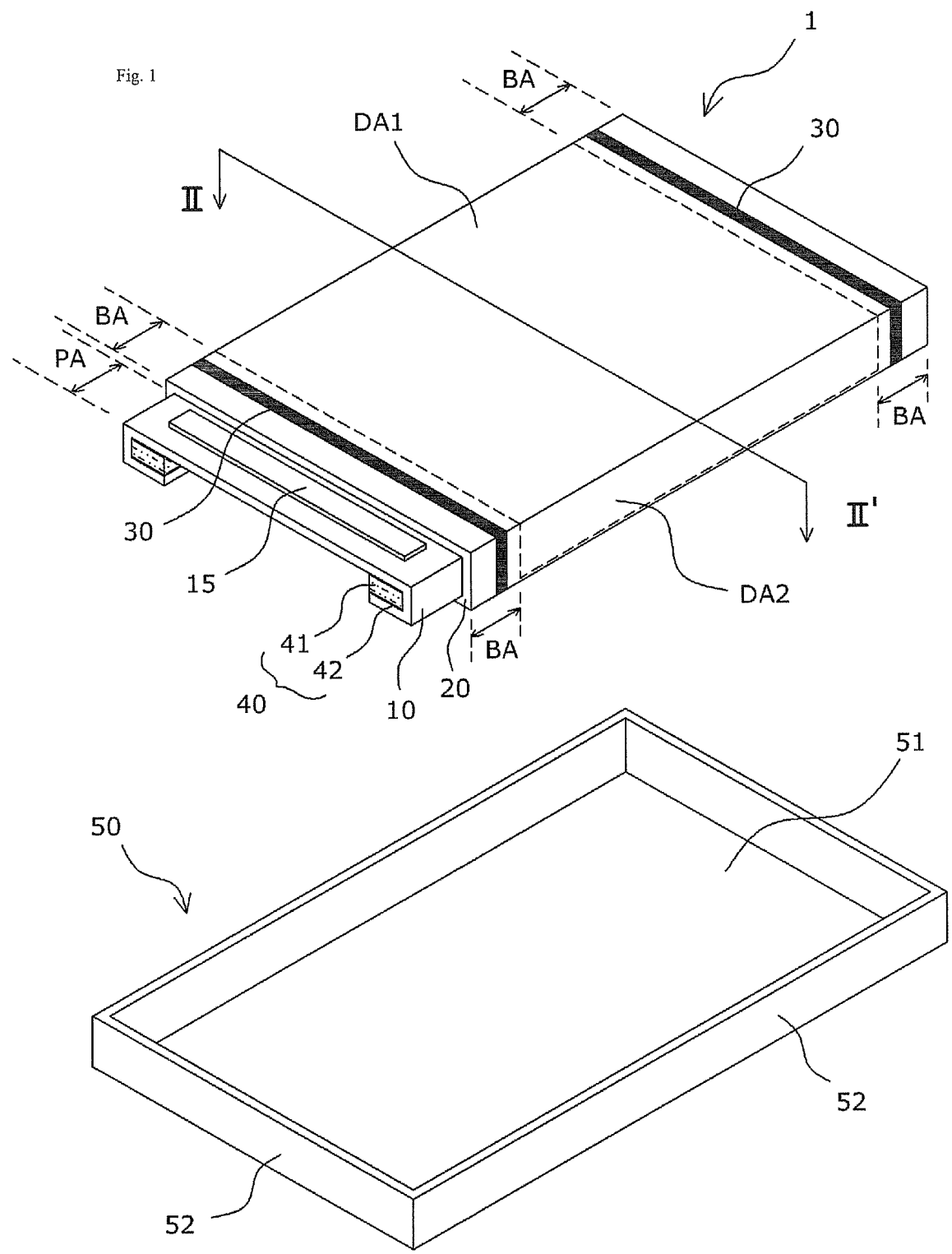
FIGS. 1-19 represent non-limiting, example embodiments as described herein.

Example embodiments will now be described more fully with reference to the accompanying drawings. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements throughout, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

At least one example embodiments relate to a display device, and more particularly, to a display device which can minimize or eliminate a non-display area including a bezel area at a front surface of the display device, or expand a display area to side surfaces of the display device.

Display devices according to some example embodiments include a display panel. The display panel includes a flexible upper substrate, at least one light emitting diode, and a flexible lower substrate. The display panel has a display area formed at a portion corresponding to the at least one light emitting diode, and a non-display area formed at a portion other than the display area. Particularly, the display panel is coupled to the support frame such that a portion of the non-display area is bent from the display area.

For example, the display panel has a square or rectangular shape and is coupled to the support frame such that at least one selected from left, right, upper and lower areas of the display panel is bent.

Before describing example embodiments, the terms "display area" and "non-display area" which will be used below are defined.

The display area means an area which displays a real visual image, and corresponds to an emitting layer, which may include light emitting diodes formed on a lower substrate. Therefore, the display area refers to an area in which a plurality of pixels is arranged in a matrix shape. Upper and lower substrate areas may be respectively formed above and below the pixel-arranged area.

The non-display area refers to an area (e.g., an opaque area) of the display panel other than the display area, which may display a real image.

Meanwhile, the term "front surface of the display panel (or the display device)" refers to a surface corresponding to a main display area. The term "side surface of the display panel (or the display device)" refers to a surface that is bent or oriented approximately perpendicular to the main display area.

Therefore, if the display panel (or the display device) has a rectangular parallelepiped shape, the display panel includes a front surface, a rear surface that is opposite to the front surface, and four side surfaces that are formed at peripheral edges of the front surface and oriented perpendicular to the front surface. The four side surfaces include front and rear side surfaces that are parallel to each other, and left and right side surfaces that are parallel to each other.

Hereinafter, some example embodiments will be described in detail with reference to the attached drawings.

Figure 2:
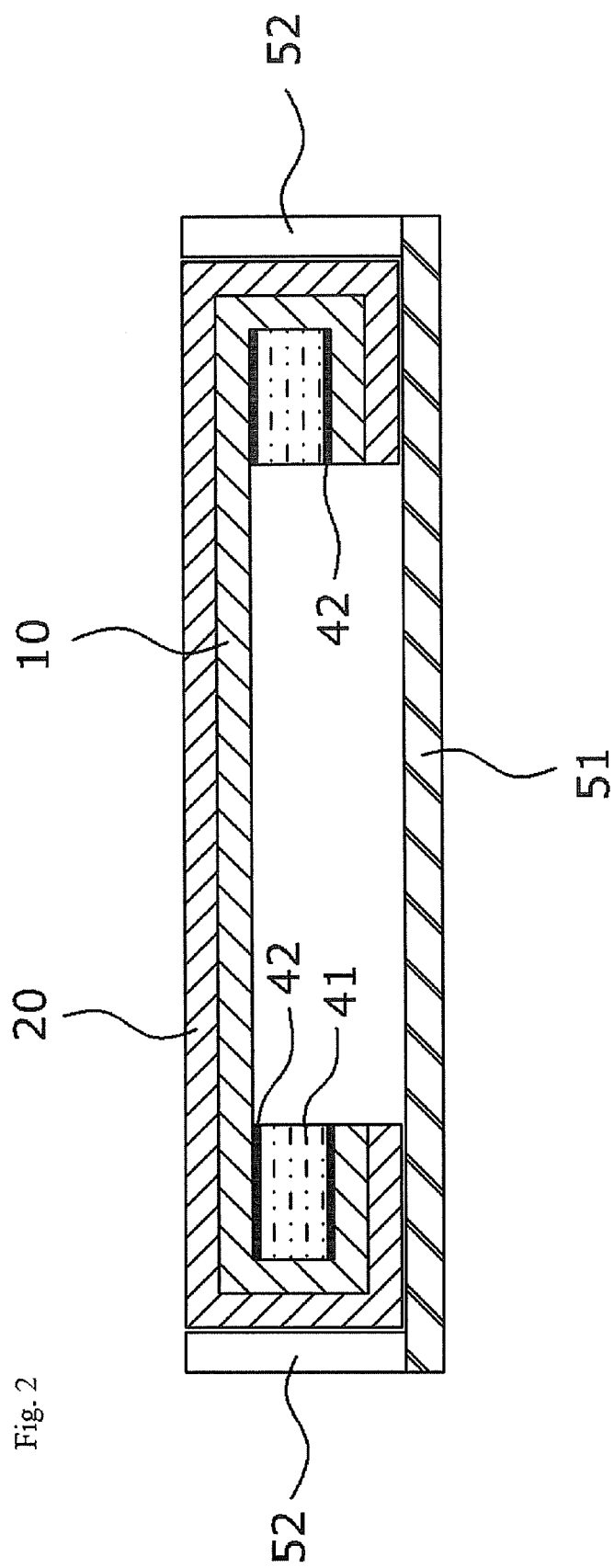

FIG. 1 is an exploded perspective view illustrating a display device according to a first example embodiment. FIG. 2 is an assembled cross-sectional view taken along line II-II' of FIG. 1.

Referring to FIGS. 1 and 2, the display device according to the first example embodiment may include a display panel 1, a support frame 50 which supports the display panel 1, and fasteners 40 which secure a bending structure of the display panel 1 in place.

The display panel 1 may be used for mobile devices such as smart phones or tablet PCs, or for large displays such as flat TVs or 3D TVs.

According to this example embodiment, the display panel 1 may include an upper substrate 20, a lower substrate 10 which is disposed to face the upper substrate 20, and an emitting layer interposed between the upper substrate 20 and the lower substrate 10.

The upper substrate 20 and/or the lower substrate 10 may be made of a flexible material. The substrates may be made of a flexible material. For example, the substrates may be made of a polymer material, which is transparent and flexible. The substrates also may be made of any of non-polymer materials so long as the materials are flexible.

If the upper substrate 20 and/or the lower substrate 10 are made of a polymer, e.g., the polymer may be polyethylene terephthalate (PET), polyethylene sulfone (PES), polyethylene naphthalate (PEN), polycarbonate (PC), polymethylmethacrylate (PMMA), polyimide (PI), ethylene-vinyl acetate (EVA), amorphous polyethylene terephthalate (APET), polypropylene terephthalate (PPT), polyethylene terephthalate glycerol (PETG), polycyclohexylenedimethylene terephthalate (PCTG), modified triacetyl cellulose (TAC), a cyclo olefin polymer (COP), a cyclic olefin copolymer (COC), a dicyclopentadiene polymer (DCPD), a cyclopentadiene polymer (CPD), polyarylate (PAR), polyetherimide (PEI), polydimethylsiloxane (PDMS), a silicone resin, a fluorine resin, a modified epoxy resin, etc.

Furthermore, the lower substrate 10 may have a pad area PA which protrudes outwards from the upper substrate 20. An integrated circuit chip 15 and a plurality of wires (not shown) extending outwards from the display area may be disposed on the pad area PA.

The integrated circuit chip 15 may generate a plurality of timing signals to apply a data drive signal and a gate drive signal at an appropriate time, and apply these timing signals to data lines (not shown) and gate lines (not shown) of the display panel. A protective film may be additionally formed around the integrated circuit chip 15 to protect the integrated circuit chip 15.

Furthermore, a pad (not shown) electrically connected to the integrated circuit chip 15 and disposed at a position adjacent to the integrated circuit chip 15 may be provided on the pad area PA of the lower substrate 10. The pad may be electrically connected to a printed circuit board (not shown) on which electronic devices are mounted to process the drive signals. For example, a flexible printed circuit board (FPCB) may be further provided as a means for connecting the pad to the printed circuit board.

The emitting layer is a display area which displays a real image, and may include at least one light emitting diode. For example, the at least one light emitting diode may be an organic light emitting diode (OLED) containing an organic compound, or an electronic ink (e-ink).

If the display device has an active matrix (AM) structure, an OLED, a thin film transistor which operates the OLED, and a wiring unit which includes gate lines and data lines may be further provided on the lower substrate 10 such that the active matrix structure corresponds to the display area. A single pixel may be defined by the corresponding gate line, data line and common power line, but example embodiments are not limited thereto.

According to this embodiment, the display area (DA1 and DA2) may correspond to an area that includes an emitting layer area in which a plurality of pixels are arranged in a matrix shape, and upper and lower substrate areas that are respectively formed above and below the emitting layer area.

A remaining area (e.g., an opaque area) other than the display area (DA1 and DA2) that substantially displays an image, may correspond to a non-display area. The non-display area may include a bezel area BA and a pad area PA.

The bezel area BA refers to an area which includes a sealing line 30 that surrounds the perimeter of the display area with a distance between the display area and the sealing line 30 so as to bond the upper substrate 20 and the lower substrate 10 to each other and seal the at least one light emitting diode therebetween, and portions of the upper and lower substrate areas that do not correspond to the display area (DA1 and DA2). Therefore, the bezel area may also include wirings that extend from the display area and are disposed outside the display area.

The pad area PA refers to an area on which the integrated circuit chip 15 is mounted to apply signals for controlling the display area (DA1 and DA2). In the example embodiment of FIG. 1, an end portion of the lower substrate 10 (i.e., a portion that protrudes outwards from the upper substrate 20) refers to the pad area PA.

According to this embodiment, the display panel may have a square or rectangular shape, and a left side area of the display panel and/or a right side area that is parallel to the left-side area are bent towards the support frame 50 and may be secured in a bent state by the fastener 40.

The left side area and/or the right side area (hereinafter, referred to in common as the "left side area") of the display panel that are bent towards the support frame 50 will be explained in detail below.

The left side area of the display panel may include a portion of the non-display area (e.g., bezel area BA) including the sealing line 30, and a portion of the display area (e.g., left side portion DA2 of the display area). Accordingly, the left side area of the display panel bending towards the support frame 50 refers to an area at which both the bezel area BA of the left side area and the portion DA2 of the display area may be bent, e.g., approximately vertically, and then only the bezel area BA of the left side area may be bent once more inwards.

Therefore, according to this embodiment, the display panel may be configured such that the bent portion DA2 (hereinafter, referred to as "bent display area") of the display area and a bent portion of the bezel area BA that extend from the bent display area may be bent together with respect to a remaining portion DA1 (hereinafter, referred to as a "non-bent display area") of the display area to have an L-shaped cross-section.

According to this embodiment, an inwardly bent portion of the bezel area BA may be disposed at a position spaced apart from the lower substrate 10 of the non-bent display area DA1 by a desired distance. The fastener 40 may be inserted into a space defined between the lower substrate 10 of the non-bent display area DA1 and the inwardly bent portion of the bezel area BA to secure the L-shaped cross-sectional bent structure in place.

According to this embodiment, the fastener 40 may include a spacer 41 which is inserted into the space between the lower substrate 10 of the non-bent display area DA1 and the inwardly bent portion of the bezel area BA so as to maintain substantially the uniform distance therebetween, and an adhesive layer 42 which is attached or applied to the spacer 41.

For example, the spacer 41 may be made of a material that is light and is able to absorb an external force or impact. A polymer foam, e.g., polystyrene, urethane foam, and the like, which is formed by foaming a resin, may be used as a material of the spacer 41.

The adhesive layer 42 may be formed of a liquid adhesive or the like which is applied to the spacer 41 or formed of a tape containing an adhesive material. The adhesive layer 42 may be applied or attached to each of the upper and lower surfaces of the spacer 41.

The upper surface of the spacer 41 may be attached to the lower substrate 10 of the non-bent display area DA1, and the lower surface of the spacer 41 may be attached to the corresponding bent portion of the bezel area BA. Accordingly, the bent display area DA2 and the bent portion of the bezel area BA can maintain the L-shaped cross-sectional structure.

According to this embodiment, the display panel may include the display area (DA1 and DA2), which can display an image not only at the front surface of the display panel but also at the left and right side surfaces thereof. Therefore, the example embodiment can provide a wider display area than the conventional display panel.

According to this embodiment, the support frame 50 may be a part that is configured to be coupled to and support the above-mentioned display panel. The support frame 50 may include a bottom part 51 which has a planar shape and supports the display panel. The support frame 50 may further include skirt parts 52 which are provided along edges of the bottom part 51 and protrude from the bottom part 51.

The support frame 50 may be made of a metal having a desired strength, for example, stainless steel (SUS), steel plate cold commercial (SPCC), aluminum, a nickel-silver alloy, magnesium, etc. At least some of the skirt parts 52 may have a window.

According to this embodiment, the skirt parts 52 of the support frame 50 having windows defined therein refer to the skirt parts 52 facing the bent display areas DA2, which are formed at the left and right side surfaces of the display panel. Each window may be one type selected from the group consisting of an opening, a transparent reinforced glass and a transparent reinforced plastic.

Therefore, the display areas DA2 provided at the left and right side surfaces of the display panel may display images to the outside through the windows.

A space defined between the lower substrate 10 of the non-bent portion of the display panel and the bottom part 51 of the support frame 50 may house the above-mentioned printed circuit board or the like may be such that the space is effectively used.

Figure 3:
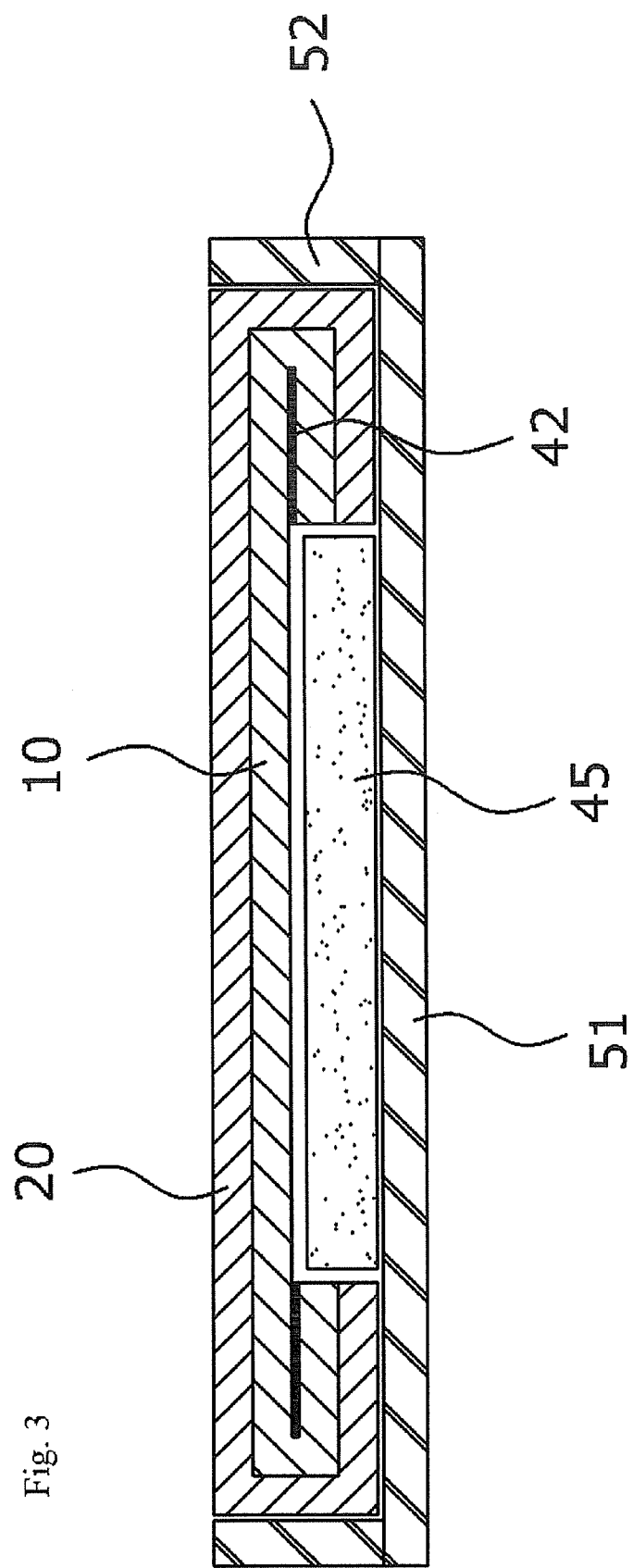

FIG. 3 is an assembled cross-sectional view illustrating a display device according to a second example embodiment. Referring to FIG. 3, the display device according to the second embodiment has generally the same construction as the first embodiment, except for the following differences. Hereinafter, the second embodiment will be explained based on the differences.

In the case of the first embodiment, the bezel area of the left or right side area of the display panel and the corresponding portion of the display area may be bent so that the display area is configured to display an image at the left or right side surface of the display panel. However, in the case of the second embodiment, only the bezel area BA of the left side area or right side area of the display panel may be bent.

According to the display panel of the second embodiment, the bezel area BA at the left side area or right side area of the display panel may be bent towards the support frame 50 to have a folded structure. The bezel area BA that has been folded onto the lower surface of the display area DA1 may be secured, e.g., attached and fixed, to a non-bent lower substrate 10, by a fastener. For example, the fastener may be the adhesive layer 42 of the first embodiment. The adhesive layer 42 may be formed of a liquid adhesive or the like that is applied to a corresponding portion, or may be formed of tape containing an adhesive material.

Therefore, the display panel of the second embodiment does not require a separate spacer like the spacer 41 of the first embodiment. The bezel area BA of the left side area or the right side area may be coupled to the support frame 50 in a bent state by the adhesive layer 42 interposed between the bent bezel area BA and the lower surface of the display area DA1.

According to the second embodiment, the skirt part may not have a window defined therein. Thus, the support frame 50 may be entirely made of metal.

A space defined between the non-bent lower substrate 10 of the display panel and the bottom part 51 of the support frame 50 may be filled with a shock absorption member 45 made of a material, e.g., sponge, polystyrene and urethane. The shock absorption member 45 can absorb external force or impact applied to the display panel.

According to the second embodiment, the display panel can provide a wider display area than the conventional display panel because the opaque area, e.g., the bezel area, which has been inevitably formed on the left and right perimeters of the front surface of the conventional display panel, can be reduced and/or removed.

Figure 4:
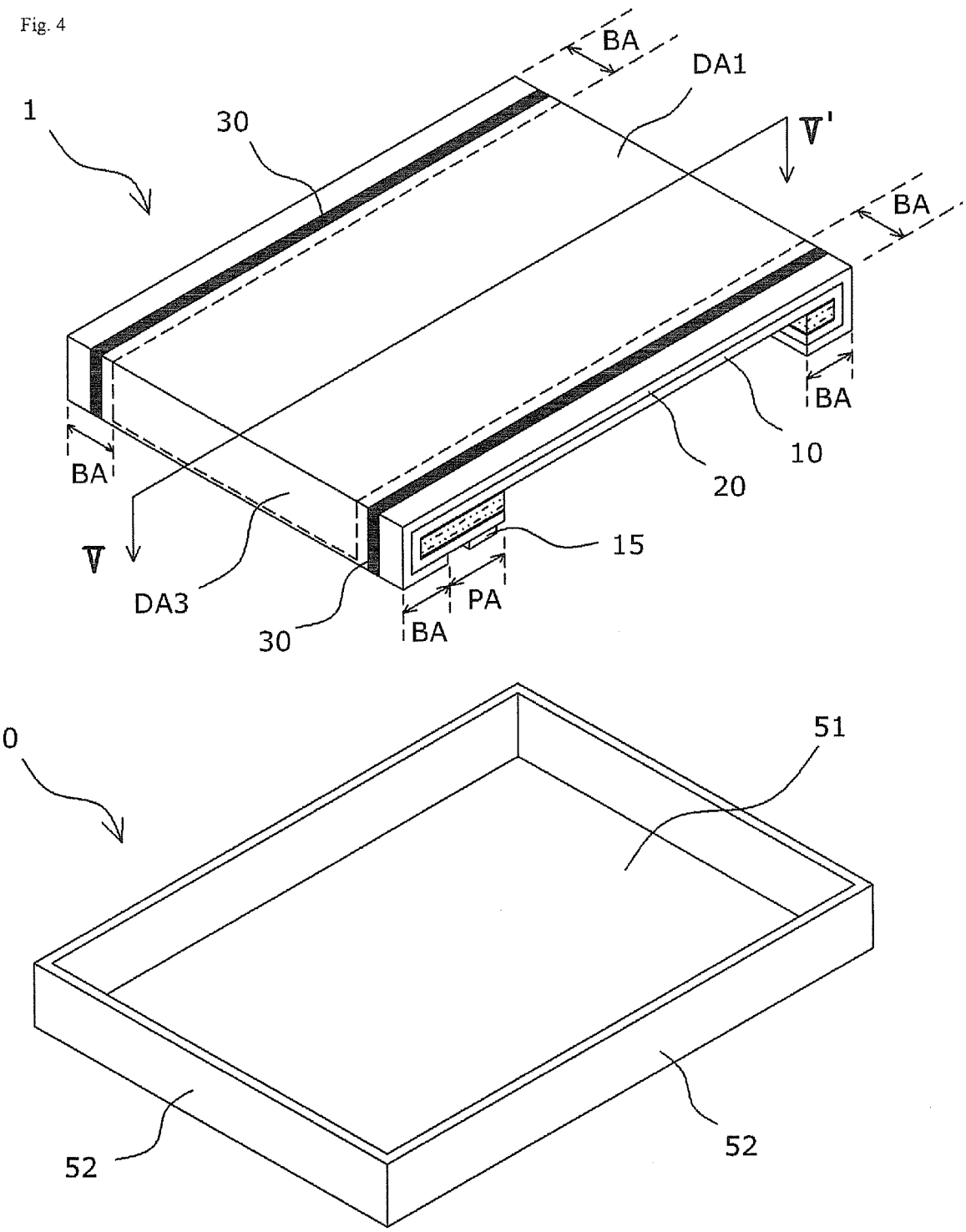
Figure 5:
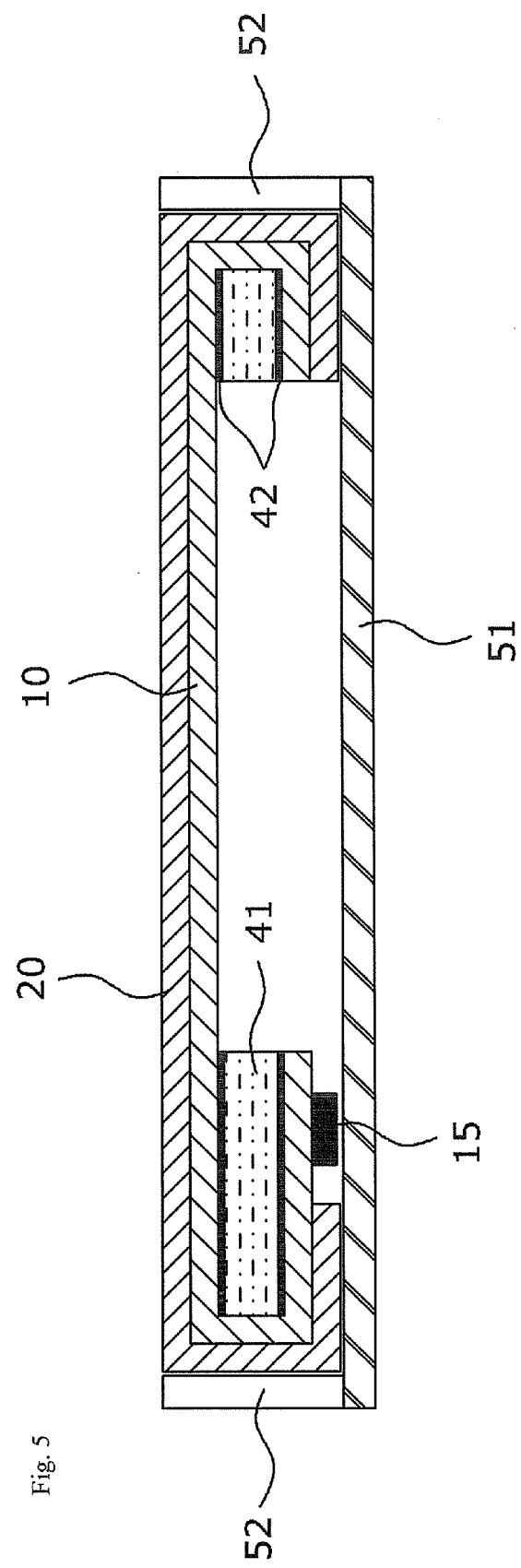

FIG. 4 is an exploded perspective view illustrating a display device according to a third embodiment, and FIG. 5 is an assembled cross-sectional view taken along a line V-V' of FIG. 4.

According to the third embodiment, the display device may include a display panel 1, a support frame 50 which supports the display panel 1, and fasteners 40 which secure a bending structure of the display panel 1 in place.

The material of the upper and lower substrates, the construction of the emitting layer, and the definition of the display area and non-display area of the display panel according to the third embodiment are the same as those of the first embodiment. Therefore, hereinafter, the third embodiment will be explained based on the differences from the first embodiment.

According to this embodiment, the display panel 1 may have a square or rectangular shape, a front side area and/or a rear side area that is parallel to the front side area may be bent towards the support frame 50, and may be secured thereto in a bent state of the display panel 1 by the fasteners 40.

The rear side area and/or front side area (hereinafter, referred to in common as the "front side area") of the display panel that are bent towards the support frame 50 will be explained in detail.

The front side area of the display panel may include a portion of the non-display area (bezel area BA) including the sealing line 30, and a portion of the display area (e.g., a front side portion of the display area). The front side area of the display panel bending towards the support frame 50 refers to an area at which both the bezel area BA of the front side area and the portion DA1 of the display area may be bent, e.g., approximately vertically, and then only the bezel area BA of the front side area may be bent once more inwards.

The rear side area of the display panel may include a non-display area (bezel area BA) including a sealing line 30, a portion of the display area (rear side portion of the display area DA3), and a portion (pad area PA) of the lower substrate that protrudes from the upper substrate 20. The rear side area of the display panel bending towards the support frame 50 refers to an area at which the bezel area BA of the rear side area, the portion DA3 of the display area and the pad area PA may be bent, e.g., approximately vertically, and then only the bezel area BA and the pad area PA of the rear side area may be bent once more inwards.

Therefore, according to this embodiment, the display panel may be configured such that the bent portion DA3 (hereinafter, referred to as the "bent display area") of the display area, a bent portion of the bezel area BA that extends from the bent display area DA3, and the pad area PA may be bent together with respect to a remaining portion DA1 (hereinafter, referred to as a "non-bent display area") of the display area to have an L-shaped cross-section.

According to this embodiment, the inwardly bent portion of the bezel area at the front side area (hereinafter, referred to as a "bent non-display area" including the inwardly bent portion of the bezel area at the rear side area) may be disposed at a position spaced apart from the lower substrate 10 of the non-bent display area DA1 by a desired distance. The fastener 40 may be inserted into a space defined between the lower substrate 10 of the non-bent display area DA1 and the bent non-display area, to secure the L-shaped cross-sectional bent structure in place.

According to this embodiment, the fastener 40 may include a spacer 41 which is inserted into the space between the lower substrate 10 of the non-bent display area DA1 and the inwardly bent portion of the bezel area BA so as to substantially maintain the uniform distance, and an adhesive layer 42 which is attached or applied to the spacer 41.

For example, the spacer 41 may be made of a material which is light and is able to absorb an external force or impact. A polymer foam, e.g., polystyrene, urethane foam, and the like, which is formed by foaming a resin may be used as a material of the spacer 41.

The adhesive layer 42 may be formed of a liquid adhesive or the like which is applied to the spacer 41 or formed of a tape containing an adhesive material. The adhesive layer 42 may be applied or attached to each of the upper and lower surfaces of the spacer 41.

The upper surface of the spacer 41 may be attached to the lower substrate 10 of the non-bent display area DA1, and the lower surface of the spacer 41 may be attached to the bent portion of the non-display area BA, PA. Accordingly, the bent display area DA3 and the bent non-display area BA, PA can maintain the L-shaped cross-sectional structure.

According to this embodiment, the display panel may include the display area (DA1 and DA3), which can display an image not only on the front surface of the display panel but also on the front and rear side surfaces thereof. Therefore, the example embodiment can provide a wider display area than the conventional display panel.

According to this embodiment, the support frame 50 may be a part that is coupled to and supports the above-mentioned display panel. The support frame 50 may include a bottom part 51 which has a planar shape and supports the display panel. For example, the support frame 50 may further include skirt parts 52 which are provided along edges of the bottom part 51 and protrude from the bottom part 51.

The support frame 50 may be made of a metal having desired strength, for example, stainless steel (SUS), steel plate cold commercial (SPCC), aluminum, a nickel-silver alloy, magnesium, etc. At least some of the skirt parts 52 may have a window.

According to this embodiment, the skirt parts 52 of the support frame 50 having windows defined therein refer to the skirt parts 52 facing the bent display areas DA3, which are formed at the front and rear side surfaces of the display panel. Each window may be one type selected from the group consisting of an opening, a transparent reinforced glass and a transparent reinforced plastic.

Therefore, the display areas DA3 provided at the front and rear side surfaces of the display panel may display images to the outside through the windows.

A space defined between the lower substrate 10 of the non-bent portion of the display panel and the bottom part 51 of the support frame 50 may house the above-mentioned printed circuit board or the like such that the space is effectively used.

Figure 6:
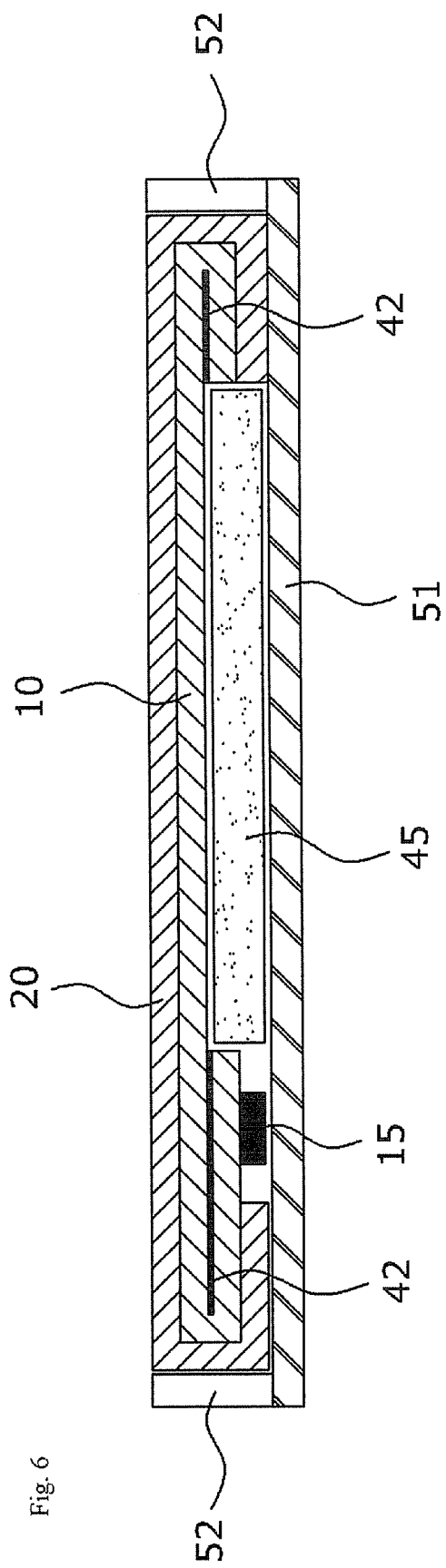

FIG. 6 is an assembled cross-sectional view illustrating a display device according to a fourth example embodiment. Referring to FIG. 6, the display device according to the fourth embodiment has generally the same construction as the third embodiment, except for the following differences. Hereinafter, the fourth embodiment will be explained based on the differences.

In the case of the third embodiment, the non-display area BA, PA of the front or rear side area of the display panel and the corresponding portion DA3 of the display area may be bent so that the display area is configured to display an image at the left or right side surface of the display panel. However, in the case of the fourth embodiment, only the non-display area BA, PA of the front or rear side area of the display panel may be bent.

According to the display panel of the fourth embodiment, the non-display area BA, PA at the front or rear side area of the display panel may be bent towards the support frame 50 to have a folded structure. The non-display area BA, PA that has been folded onto the lower surface of the display area DA1 may be secured, e.g., attached and fixed, to the non-bent (or alternatively, flat) lower substrate 10 by an adhesive layer 42. For example, the adhesive layer 42 may be formed of a liquid adhesive or the like that is applied to a corresponding portion or be formed of tape containing an adhesive material.

Therefore, the display panel of the fourth embodiment does not require a separate spacer like the spacer 41 of the third embodiment. The non-display area BA, PA of the front side area or rear side area of the display panel may be coupled to the support frame 50 in a bent state by the adhesive layer 42 interposed between the bent non-display area BA, PA and the lower surface of the display area DA1.

According to the fourth embodiment, the skirt part may not have a window defined therein. Thus, the support frame 50 may be entirely made of metal.

A space defined between the non-bent lower substrate 10 of the display panel and the bottom part 51 of the support frame 50 may be filled with a shock absorption member 45 made of a material, e.g., sponge, polystyrene and urethane. The shock absorption member 45 can absorb external force or impact applied to the display panel.

According to the fourth embodiment, the display panel can provide a wider display area than the conventional display panel because the opaque area, e.g., the bezel area, which has been inevitably formed on the left and right perimeters of the front surface of the conventional display panel, can be removed.

Figure 7:
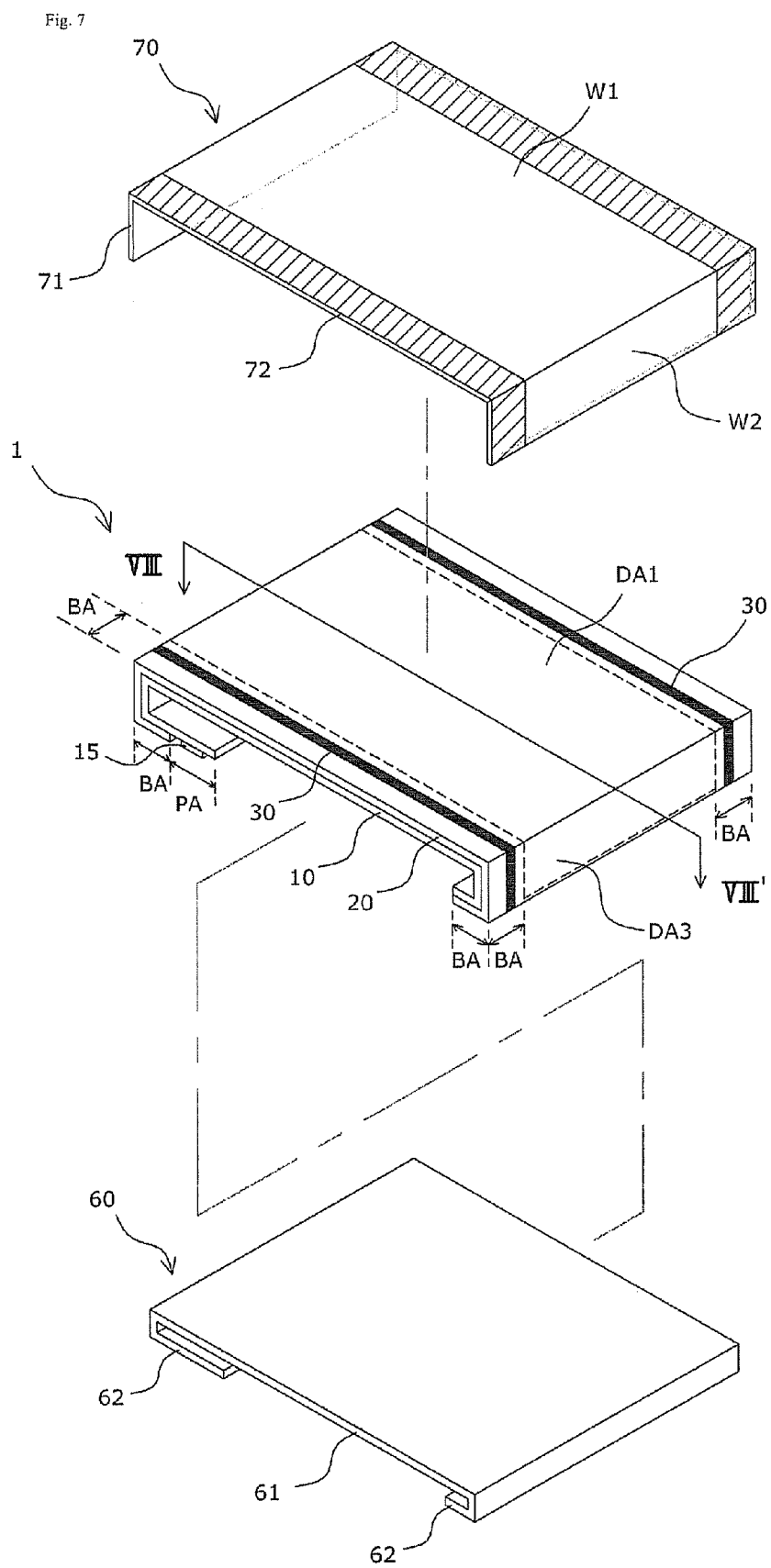
Figure 8:
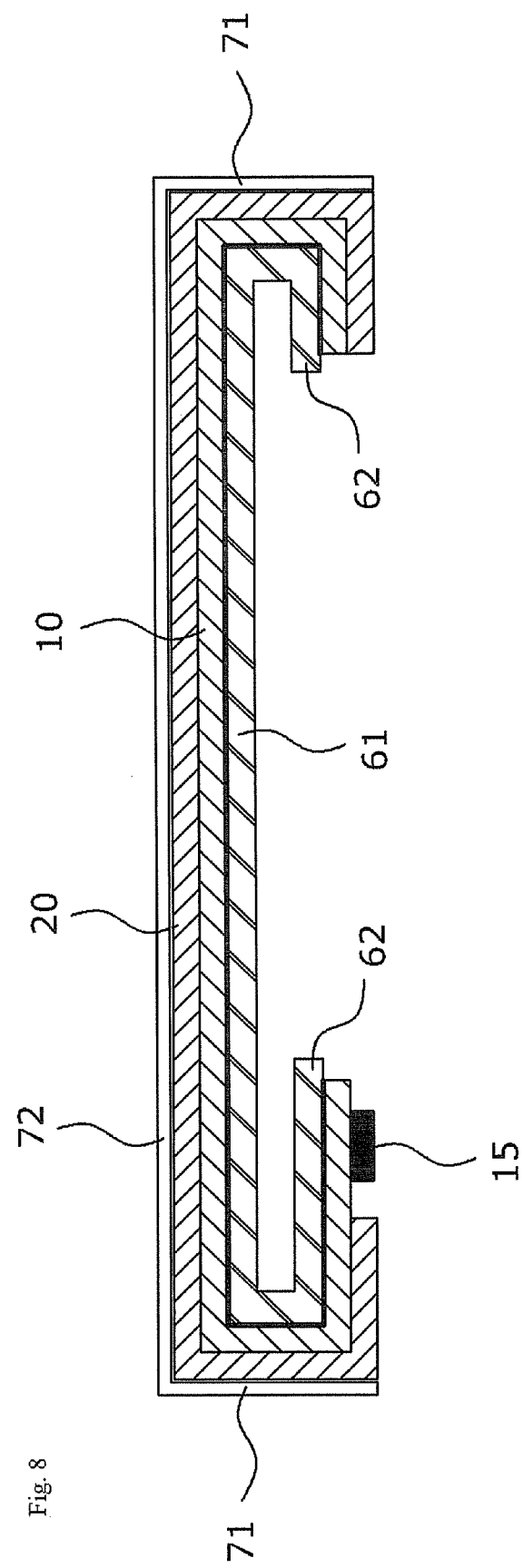

FIG. 7 is an exploded perspective view illustrating a display device according to a fifth example embodiment, and FIG. 8 is an assembled cross sectional view taken along a line VIII-VIII' of FIG. 7.

Referring to FIGS. 7 and 8, the display device according to the fifth embodiment has generally the same construction as the third embodiment, except for the following differences. Hereinafter, the fifth embodiment will be explained based on the differences.

In the same manner as the third embodiment, a display panel 1 according to the fifth embodiment may be configured such that a non-display area BA, PA of a rear or front side area and a portion DA3 of a display area are bent, e.g., approximately vertically, with respect to an non-bent portion DA1 of the display area and then only the non-display area BA, PA of the rear side area (or front side area) is bent once more inwards.

In the display panel 1 according to the fifth embodiment, a space may be formed between the non-display area BA, PA of the rear or front side area, which is bent inwards, and a lower substrate 10, which is not bent.

In the case of the third embodiment, the fastener 40 may be inserted in the space to maintain the L-shaped cross-sectional structure, but in the fifth embodiment, a portion of a support frame 60 may be inserted into the space so as to not only maintain the bending structure of the bent display area DA3 and the non-display area BA, PA but to also support the display panel.

For example, the support frame 60 may include a planar part 61, and bent parts 62. The bent parts may be formed, for example, by respectively bending inwards a first side edge and a second side edge of the planar part 61, the first side edge and the second side edge facing each other, so that each bent part 62 has a U-shaped cross-section. The support frame 60 may be coupled to the display panel such that an outer surface of the support frame 60 is covered by the display panel. In other words, the bent portion DA3 of the display area and the bent non-display area BA, PA may be bent along the bent part 62 of the support frame 60 and secured, e.g., attached or fixed, to an outer surface of the bent part 62.

If an adhesive layer like the adhesive layer 42 of the second embodiment is interposed between the outer surface of the support frame 60 and the lower substrate 10 of the display panel covering the support frame 60, the display panel can be reliably attached to the support frame 60.

Referring to FIG. 8 illustrating the assembled state of the display device according to the fifth embodiment, the bent parts 62 of the support frame 60 may be inserted into the respective spaces defined in the display panel and support the bent front and rear side areas of the display panel. The planar part 61 of the support frame 60 may be disposed under the non-bent portion of the lower substrate 10, thus supporting the non-bent portion of the display panel.

The display device according to the fifth embodiment may further include a top cover 70. The top cover 70 may be disposed on the display panel. For example, the top cover 70 may include a cover part 72 covering and/or protecting the front surface of the display panel, and skirt parts 71 respectively covering and/or protecting upper and lower side surfaces of the display panel. Each of the skirt parts 71 extends, e.g., perpendicularly, from the corresponding edge of the cover part 72 to a desired height.

The top cover 70 may include windows W1 and W2 respectively formed at a portion of the cover part 72 and at portions of the skirt parts 71 that correspond to at least the display areas DA1 and DA3. Each of the windows W1, W2 is one type selected from the group consisting of a transparent reinforced glass and a transparent reinforced plastic.

Figure 9:
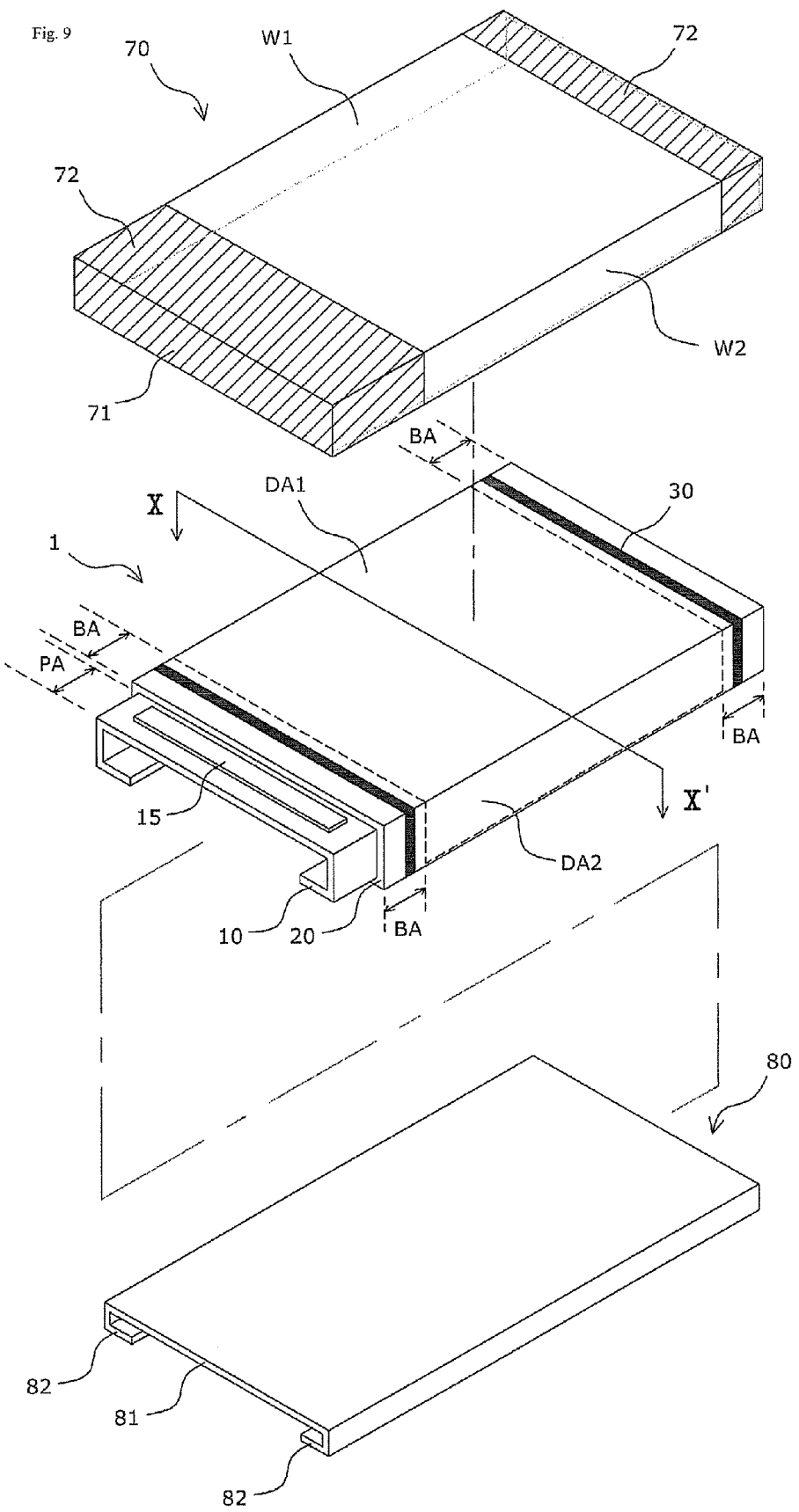

In the fifth embodiment, although the skirt parts 71 have been illustrated as being formed at the front and rear edges of the cover part 72, the skirt parts may be provided at all four edges of the cover part 72 to form a rectangular-parallelepiped top cover, as shown in FIG. 9.

Furthermore, the cover part 72 and the skirt parts 71 of the top cover may be formed of different members, which are physically separated from each other, or alternatively, may be integrally formed by molding.

Figure 10:
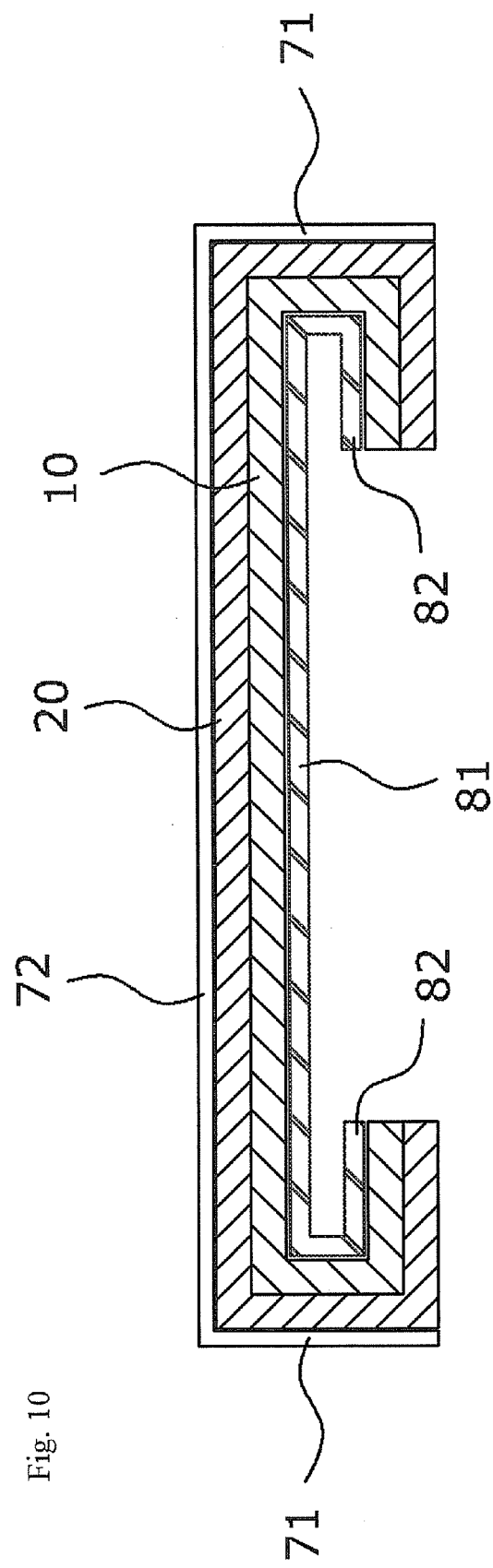

FIG. 9 is an exploded perspective view illustrating a display device according to a sixth example embodiment, and FIG. 10 is an assembled cross-sectional view taken along a line X-X' of FIG. 9.

Referring to FIGS. 9 and 10, the display device according to the sixth embodiment generally has the same construction as the fifth embodiment, except for the following differences. Hereinafter, the sixth embodiment will be explained based on the differences.

The display panel 1 according to the sixth embodiment may be configured such that a bezel area BA of a left side area (or right side area) and a portion DA2 of a display area are bent, e.g., approximately vertically, and then only the non-display area of the left-side area (or right-side area) is bent once more inwards.

Accordingly, in the display panel 1 according to the sixth embodiment, a space may be formed between the non-display area BA of the left side area (or right side area) e, which is bent inwards, and a lower substrate 10, which is not bent.

In the same manner as the fifth embodiment, a support frame 80, first and second side edges of which are bent to have an L-shaped cross-section, may be inserted into the space defined in the display panel 1. Thus, the support frame 80 may be coupled to the display panel 1 such that the support frame 80 is covered with the display panel 1.

Referring to FIG. 10 illustrating the assembled state of the display device according to the sixth embodiment, bent parts 82 of the support frame 80 may be inserted into the respective spaces defined in the display panel and support the bent left and right side areas of the display panel. A planar part 81 of the support frame 80, which is not bent, may be disposed under the non-bent portion of the lower substrate 10, thus supporting the non-bent portion of the display panel.

The display device of the sixth embodiment may further include a top cover and an adhesive layer in the same manner as the fifth embodiment, therefore further explanation as to these elements will be omitted.

Figure 11:
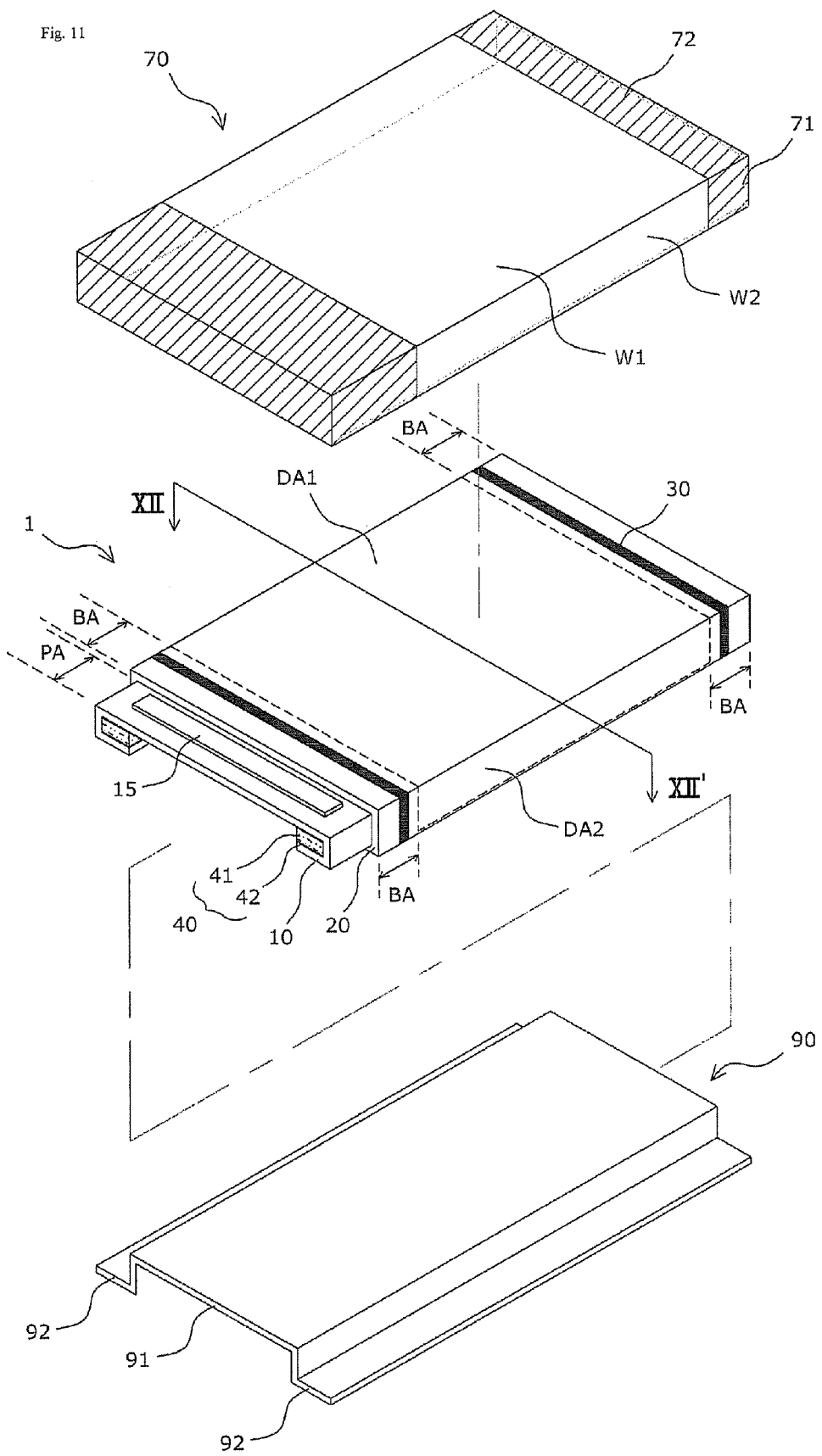
Figure 12:
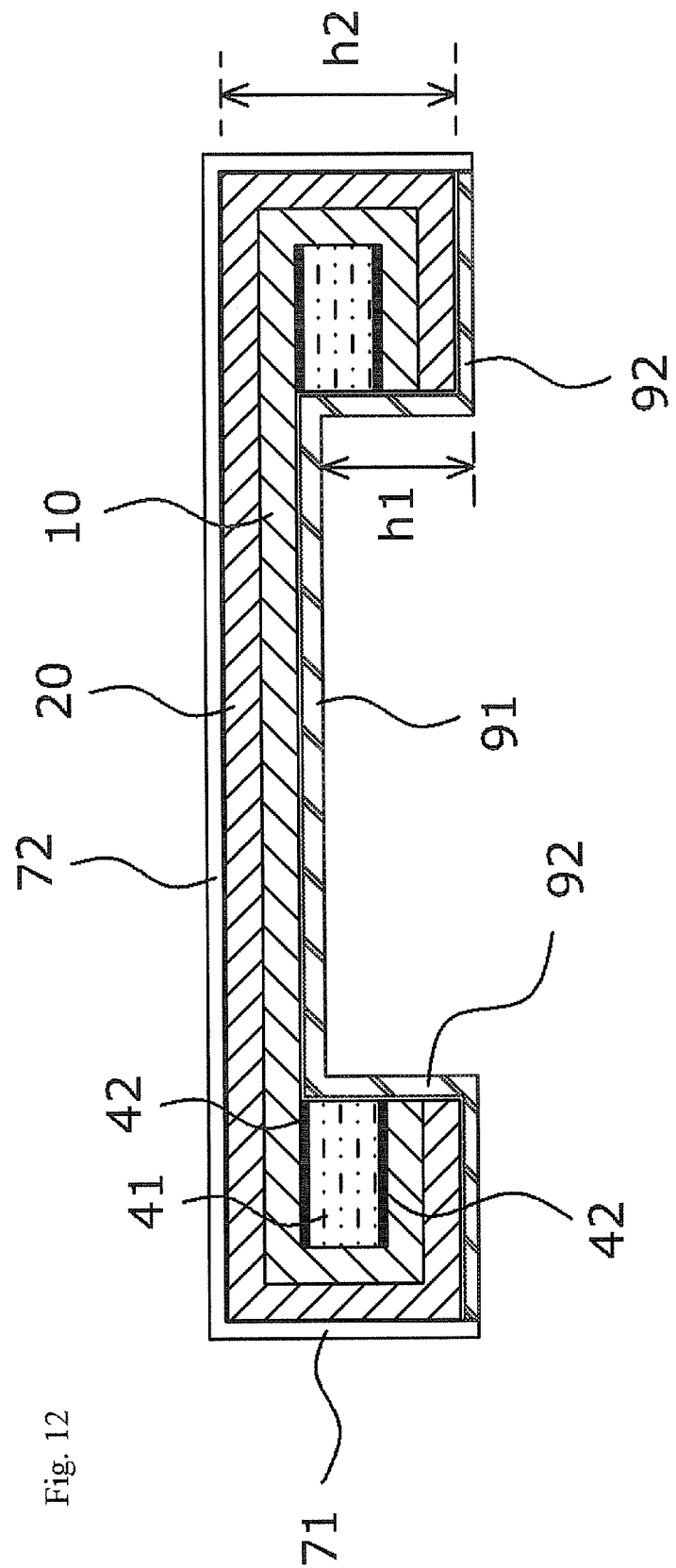

FIG. 11 is an exploded perspective view illustrating a display device according to a seventh example embodiment, and FIG. 12 is an assembled cross-sectional view taken along a line XII-XII' of FIG. 11.

Referring to FIGS. 11 and 12, the general construction of the display device according to the seventh embodiment is the same as that of the first embodiment, but the structure of a support frame of the seventh embodiment is different from that of the first embodiment, and the seventh embodiment further includes a top cover unlike the first embodiment.

The support frame 90 according to the seventh embodiment may be formed of a planar member, opposing side edges of which are respectively bent outwards to have an L-shaped cross-section. For example, the opposing side edges may be parallel to each other. Accordingly, the support frame may be formed to have a stepped shape such that a non-bent part 91 protrudes from bent parts 92 with a height difference.

The non-bent part 91 of the support frame 90 may be disposed in a space defined between the bent left and right side areas of the display panel 1 so that the non-bent part 91 can directly support the lower substrate 10 that is not bent. The bent parts 92 may cover and support portions of the corresponding bent left and right side areas of the display panel 1.

Therefore, a height h1 of the stepped shape formed by the non-bent part 91 and the bent parts 92 of the support frame 90 may be determined in proportion to a height h2 of the bent display area.

A top cover 70 of the seventh embodiment may be disposed on the display panel 1. For example, the top cover 70 may include a cover part 72 which covers and protects a front surface of the display panel 1, and skirt parts 71 which cover and protect side surfaces of the display panel 1. The skirt parts 71 may be provided, e.g., vertically, on the respective edges of the cover part 72 with a desired height.

The top cover 70 may include windows W1 and W2 respectively formed at a portion of the cover part 72 and at portions of the skirt parts 71 that correspond to at least the display areas DA1 and DA3. In the case of the seventh embodiment, the display area DA2 may be provided at each of the left and right side surfaces of the display panel. Therefore, the windows W2 may be provided at left and right skirt parts 71 of the top cover 70. Each of the windows W1, W2 may be one type selected from the group consisting of a transparent reinforced glass and a transparent reinforced plastic.

Furthermore, the cover part 72 and the skirt parts 72 of the top cover 70 may be formed of different members, which are physically separated from each other, or alternatively, may be integrally formed by molding.

Figure 13:
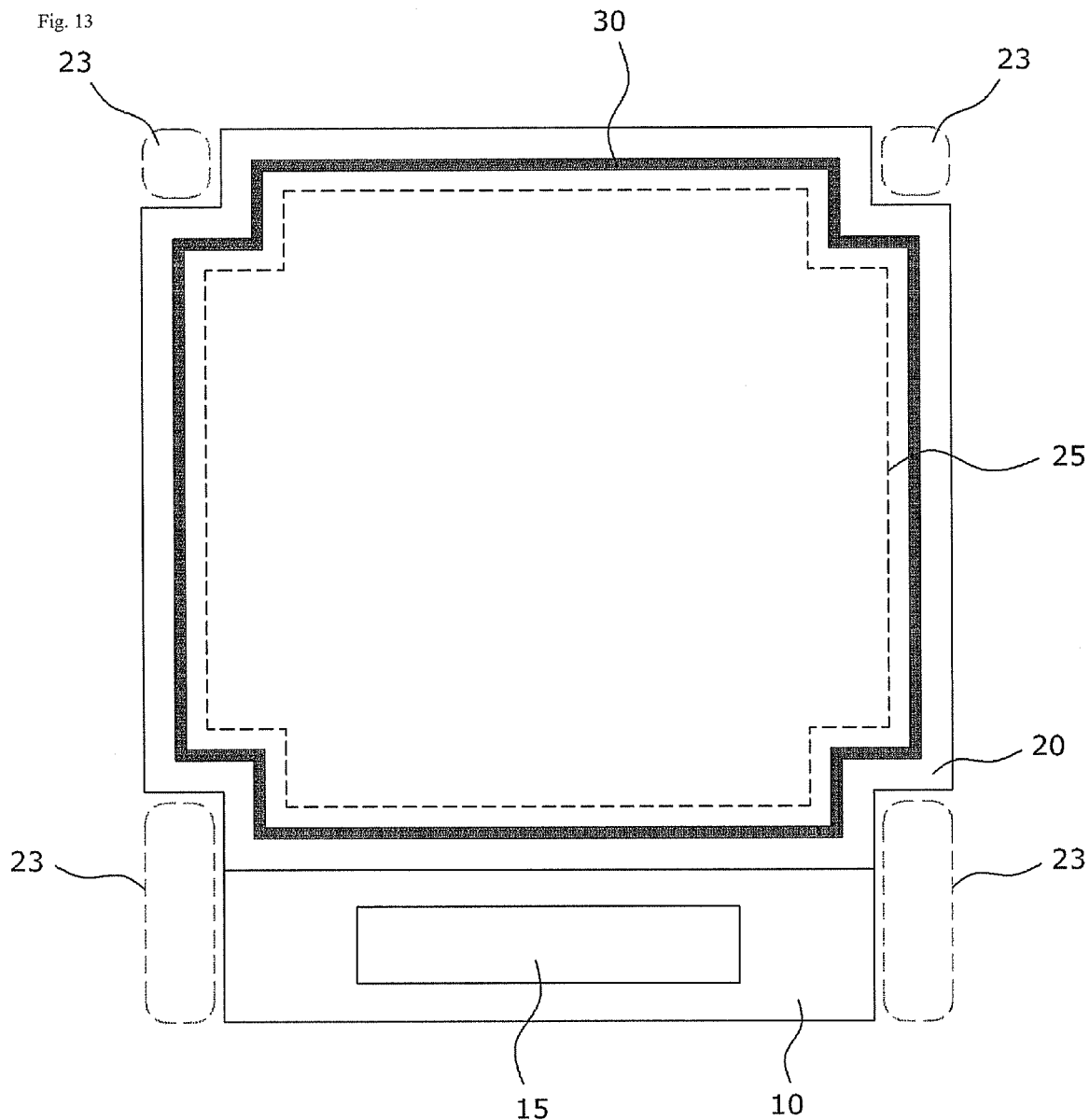
Figure 14:
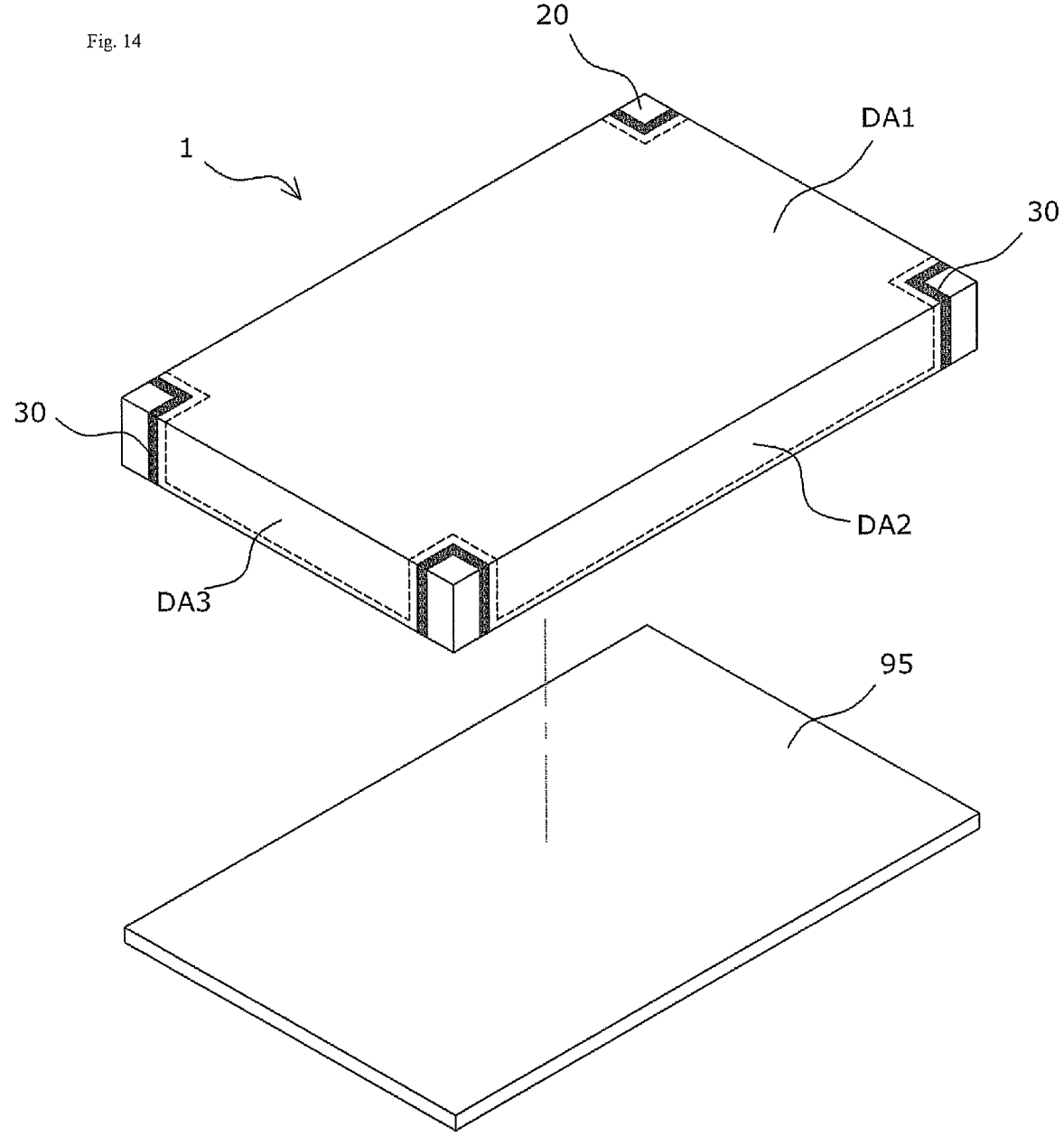

FIG. 13 is a plan view of a display panel when it is not in a bent state according to an eighth example embodiment, and FIG. 14 is an exploded perspective view illustrating a display device provided with the display panel of FIG. 13.

Each of the first through seventh embodiments described above may be configured such that up to two side areas selected from the left, right, front and rear side areas of the display panel are bent.

However, the eighth embodiment provides a structure of the display panel in which all of the left, right, upper and lower side areas of the display panel 1 are bent to maximize the expandability of the display area.

Referring to FIGS. 13 and 14, the display panel 1 according to the eighth embodiment may have a square or rectangular shape. At least two or four, corner areas 23 of the display panel 1 may be chamfered.

For example, the display panel 1 of the eighth embodiment is configured such that corner areas 23 of upper and lower substrates 20, 10 are chamfered. Furthermore, in the case where the display area can also be formed at the side surfaces of the display panel, an emitting layer 25 and a sealing line 30 of the display panel may have chamfered shapes corresponding to the corner areas 23 of the chamfered upper and lower substrates.

For example, each chamfered shape may have an approximate L shape. Accordingly, if each of the four corners 23 of the rectangular display panel is chamfered in an approximate L shape, the display panel generally may have a thick cross shape.

As such, the display panel according to the eighth embodiment may be configured such that at least two corner areas 23 are chamfered. In addition, as shown in FIG. 14, the display panel may be coupled to a support frame 95 such that at least one side area corresponding to both of the at least two chamfered corner areas 23 is bent and coupled to the support frame 95.

For example, the side areas of the display panel including the chamfered corner areas 23 of the display panel may include a non-display area including the sealing line 30, and portions DA2, DA3 of the display area. The display panel according to the eighth embodiment may be configured such that both bezel areas BA of the side areas and the portions DA2 and DA3 of the display area are bent together, e.g., approximately vertically, and then only the bezel areas BA of the side areas are bent once more inwards.

A support frame 95 of the eighth embodiment may be formed to have a plate shape and support a lower surface of the display panel. The shape or structure of the support frame 95 is not limited thereto so long as the shape or structure of the support frame can reliably support the display panel.

As illustrated in the eighth embodiment, referring to FIG. 14, if all of the four corner areas of the rectangular display panel are chamfered and all of the four side areas are bent, the display panel can provide a display area not only at the front surface but also at the left, right, front and rear side surfaces thereof.

Figure 15:
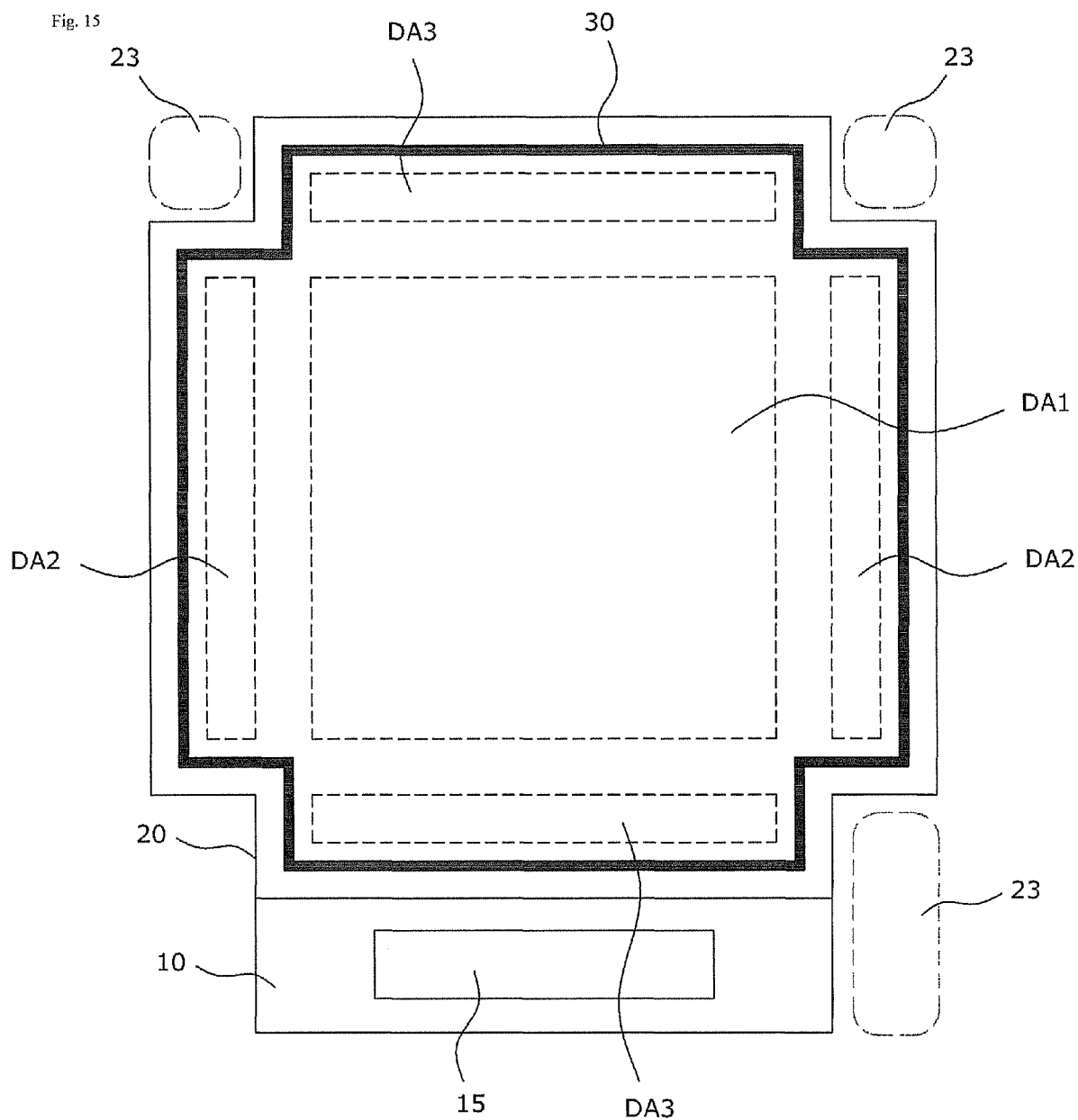
Figure 16:
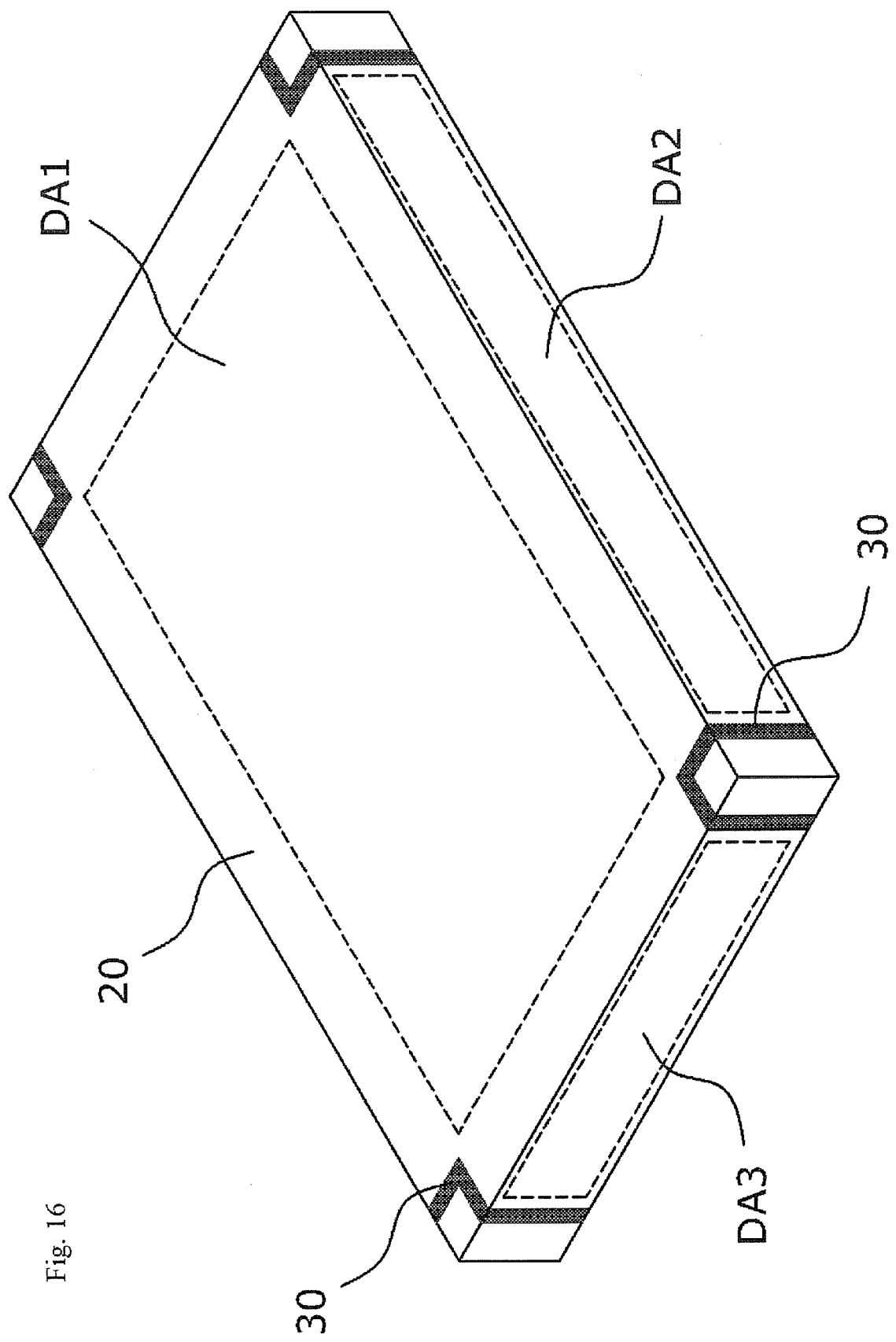

FIG. 15 is a plan view of a display panel when it is not in a bent state, according to a ninth example embodiment, and FIG. 16 is an exploded perspective view illustrating a display device using the display panel of FIG. 15.

The general construction of the display device according to the ninth embodiment is the same as that of the eighth embodiment, but there are the following differences therebetween.

The display panel according to the ninth embodiment may be configured such that at least two corner areas 23 are chamfered, and the display panel may be coupled to a support frame 95 such that at least one side area including both of the at least two chamfered corner areas 23 is bent and coupled to the support frame 95.

According to this embodiment, the side areas of the display panel 1 that include the chamfered corner areas 23 may have a non-display area including the sealing line 30, and portions DA2 and DA3 of the display area.

Further, each side area corresponding to respective chamfered corner areas 23 of the display panel 1 may be bent, e.g., approximately vertically with respect to a non-bent display area DA1, thereby forming the display area at the side surfaces of the display panel 1.

A support frame of the ninth embodiment has a plate shape and supports a lower surface of the display panel. The shape or structure of the support frame is not limited thereto so long as the shape or structure of the support frame can reliably support the display panel.

As such, the general construction of the ninth embodiment is the same as that of the eighth embodiment, but the structure of the emitting layer of the ninth embodiment is different from that of the eighth embodiment. As shown in FIG. 15, in the display panel according to the ninth embodiment, each side area corresponding to respective chamfered corner areas also may include a display area (e.g., an emitting layer, hereinafter referred to as a "side display area" DA2, DA3). The side display areas DA2 and DA3 according to the ninth embodiment may be provided separately from the main display area DA1 formed at a central portion of the display panel.

Accordingly, if the display panel of the display of the ninth embodiment has four chamfered corner areas, four side areas corresponding to the four chamfered corner areas may be formed. Furthermore, four side display areas corresponding to the respective side area may be formed.

According to the ninth embodiment, the display panel can provide a display area which can display an image not only at the front surface but also at the left, right, front and rear side surfaces thereof.

In the case of the eighth embodiment, the display device may provide a single screen in which the front display area is continuously connected to the side display areas. On the other hand, the display device of the ninth embodiment may be configured such that the emitting layers corresponding to the side display areas DA2 and DA3 are spaced apart from the emitting layer corresponding to the front display area DA1. Accordingly, unlike the eighth embodiment, the ninth embodiment, referring to FIG. 6, provides a multi-screen structure in which the front display area DA1 and the display areas DA2 and DA3 are discontinuous and/or are independent to each other.

Figure 17:
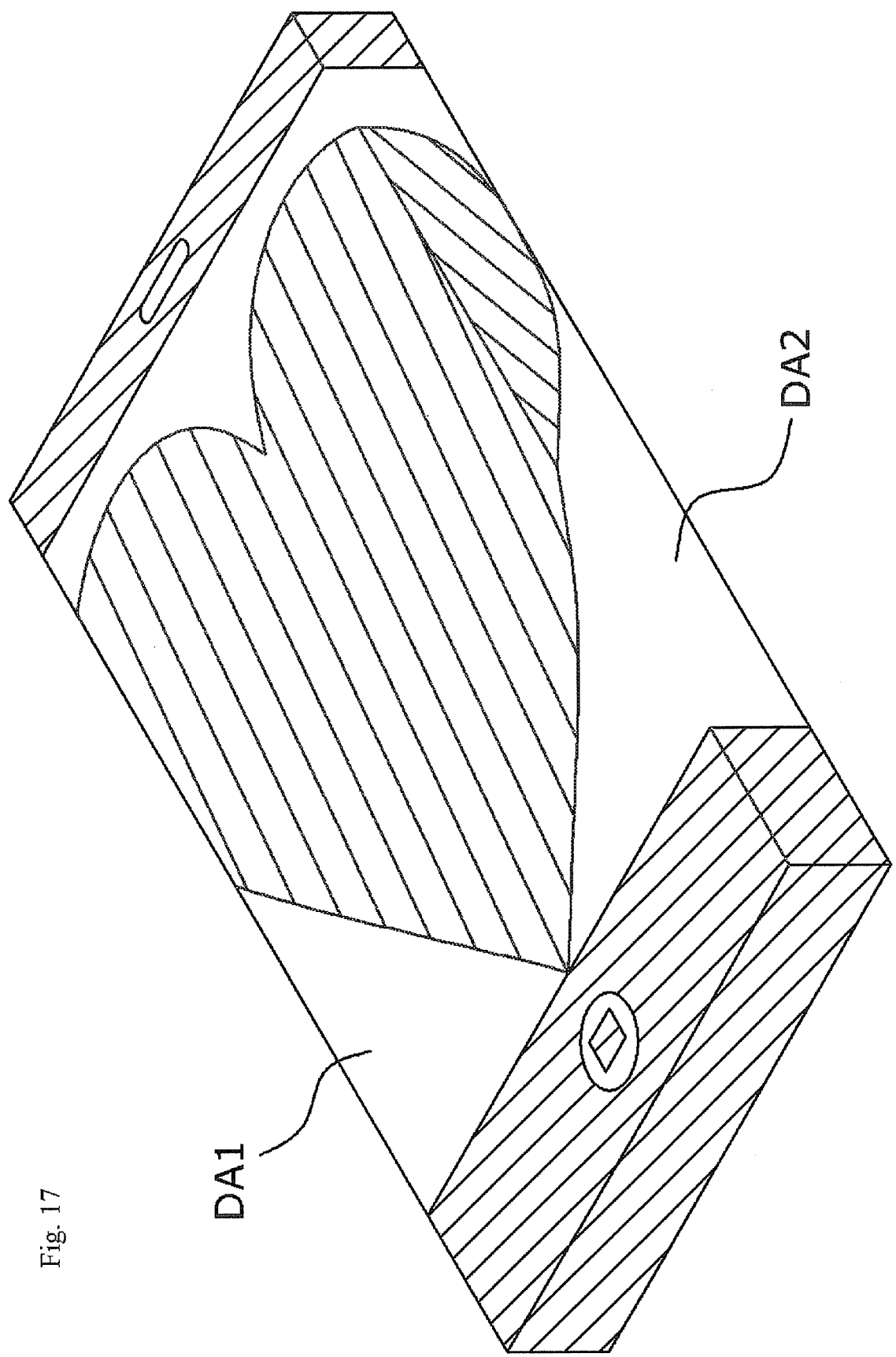
Figure 18:
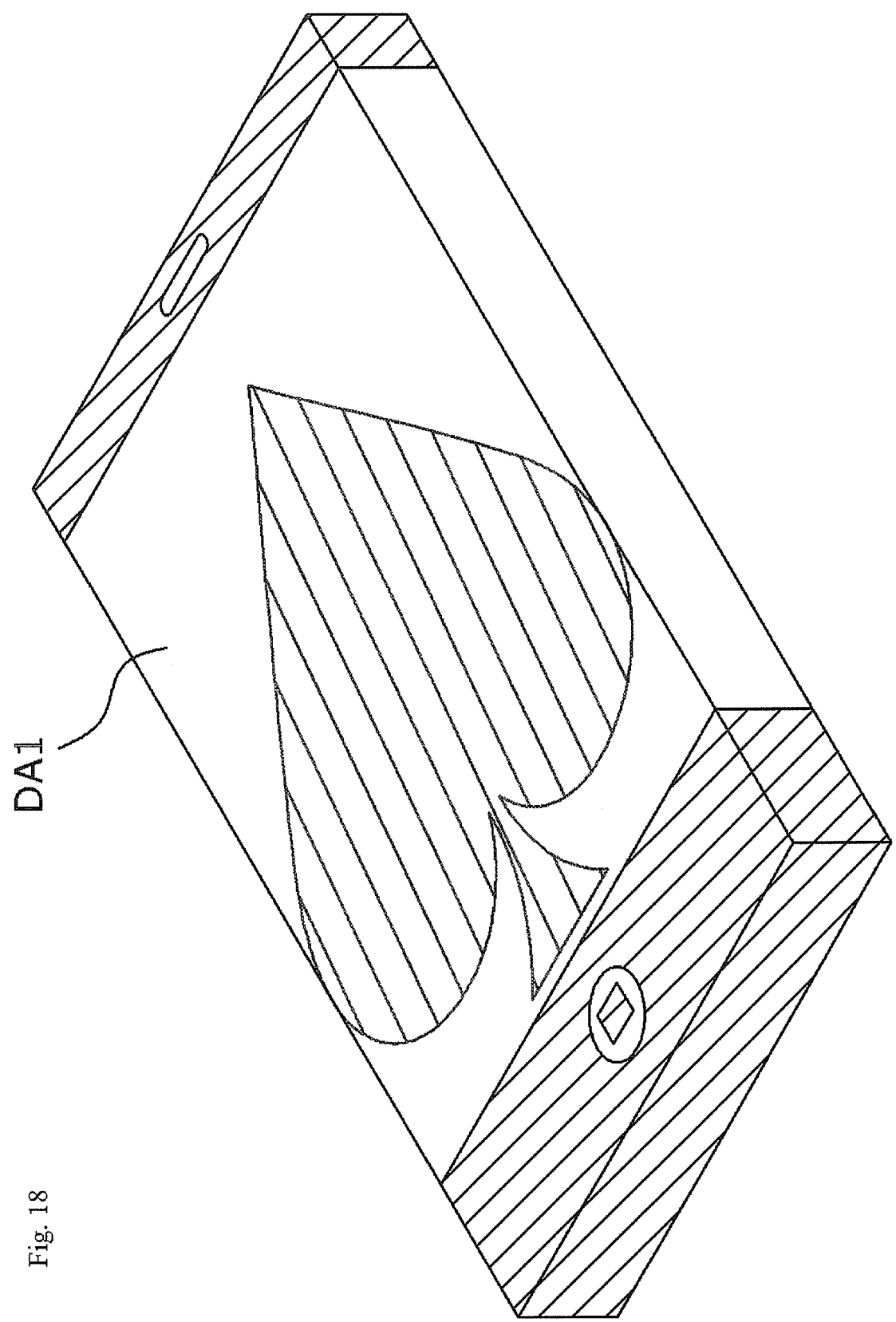
Figure 19:
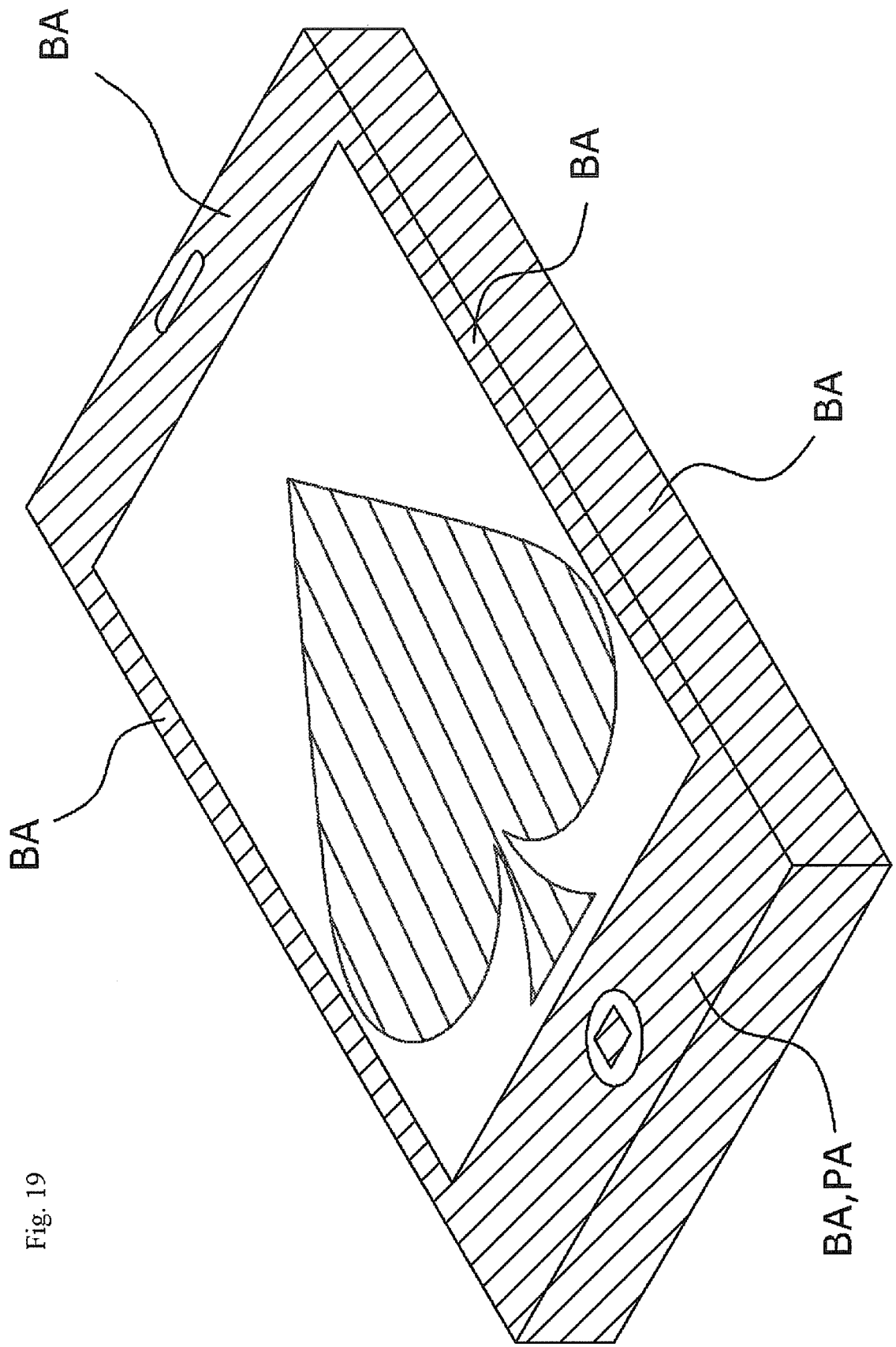

FIGS. 17 and 18 are schematic views illustrating display devices using display panels according to example embodiments. For example, the display of FIG. 17 is a display device of, for example, a smart phone, using the display panel of the first, sixth or seventh embodiment. As illustrated in FIG. 17, the display device according to the example embodiment has the display areas DA1 and DA2 so that an image can be displayed not only at the front surface of the display device but also at the left and right side surfaces thereof, thus providing a wider display area than the conventional display panel.

The display device of FIG. 18 is a display device of, for example, a smart phone, using the display panel of the second embodiment. As shown in FIG. 18, the display device according to this embodiment can remove the opaque areas, e.g., the bezel areas, which have been inevitably formed on the left and right peripheries of the conventional display panel. Therefore, the display device of this embodiment can provide a wider display area than the conventional display panel.

Although the example embodiments have been illustrated using specific terms or words, those skilled in the art will appreciate that these terms are only for clearly illustrating the example embodiments, and the terms or the embodiments can be variously modified without departing from the scope and spirit of the example embodiments as disclosed in the accompanying claims. Such modified embodiments must not be understood as being provided separately from the scope and spirit of the example embodiments, and they must be regarded as falling within the bounds of the accompanying claims.

We claim:

1. A display device, comprising:
   a display panel including,
      a flexible upper substrate,
      at least one light emitting diode, and
      a flexible lower substrate, the display panel having a display area corresponding to the light emitting diode, and a non-display area other than the display area; and
   a support frame coupled to the display panel,
   wherein the display panel is coupled to the support frame such that a portion of the non-display area is bent with respect to the display area.

2. The display device according to claim 1, wherein the display panel has a square or rectangular shape, and at least one selected from left, right, upper and lower areas of the display panel has a bent structure and is coupled to the support frame.

3. The display device according to claim 1, wherein the display area of the display panel has a bent portion,
   wherein the bent portion of the display area is oriented downwards with respect to a remaining non-bent portion of the display area to provide the display area both at a front surface of the display panel and at side surfaces thereof.

4. The display device according to claim 1, wherein the display panel is configured such that at least two corner areas are chamfered, and a side area of the display panel corresponding to two chamfered corner areas is bent and is coupled to the support frame 95.

5. The display device according to claim 4, wherein the side area of the display panel corresponding to the two chamfered corner areas includes,
   a non-display area having a sealing line, and
   a portion of the display area, and
   wherein the side area is bent downwards from the remaining non-bent portion of the display area such that the display area is both at a front surface of the display panel and at a side surface thereof.

6. The display device according to claim 3, wherein the display panel is configured such that the bent portion of the display area and the bent portion of the non-display area extending from the bent portion of the display area are bent inwards with respect to the remaining non-bent portion of the display area to have an L-shaped cross-section.

7. The display device according to claim 1, further comprising:
   a fastener interposed between a non-bent portion of the flexible lower substrate and the bent portion of the non-display area,
   wherein the bent portion of the non-display area is secured in a bent structure to the non-bent portion of the flexible lower substrate by the fastener.

8. The display device according to claim 7, wherein the fastener comprises:
   a spacer disposed in a space defined between the non-bent portion of the flexible lower substrate and the bent portion of the non-display area to maintain a distance therebetween; and
   an adhesive layer attached or applied to the spacer.

9. The display device according to claim 1, wherein the non-display area comprises:
   a bezel area having a sealing line provided along a perimeter of the display area to bond the upper substrate and the lower substrate to each other and seal the upper and lower substrates; and
   a pad area being a portion of the lower substrate that protrudes outwards from the upper substrate and having an area to which an integrated circuit chip for applying a control signal to the display area is mounted, wherein at least a portion of the bent portion of the non-display area includes at least one of a portion of the bezel area and the pad area.

10. The display device according to claim 3, wherein the support frame has a side window facing the bent portion of the display area.

11. The display device according to claim 3, further comprising:
a cover part covering and protecting the front surface of the display panel, the cover part including a window formed at a portion corresponding to at least the display area.

12. The display device according to claim 3, further comprising:
a skirt part covering and protecting the side surfaces of the display panel, the skirt part including a window formed at a portion corresponding to at least the display area.

13. The display device according to claim 12, wherein the window is one of an opening, a transparent glass panel and a transparent plastic panel.

14. The display device according to claim 3, wherein the support frame comprises:
a planar part; and
a bent part formed by bending at least one side edge of the planar part inwards, the bent part having a 'U'-shaped cross-section, and wherein
the bent portion of the display area and the bent portion of the non-display area are formed along the bent part and are secured to an outer surface of the bent part.

15. The display device according to claim 14, further comprising
an adhesive layer interposed between the bent part of the support frame and the bent portion of the non-display area, wherein the bent portion of the non-display area is attached to the outer surface of the bent part by the adhesive layer.

16. The display device according to claim 1, wherein a printed circuit board or a shock absorption member is disposed in a space defined between a non-bent portion of the lower substrate of the display panel and a bottom part of the support frame.

17. The display device according to claim 1, wherein the support frame comprises:
a planar member, each of opposite side edges of the planar member being parallel to each other and being bent outwards to have an L-shaped cross-section.

18. The display device according to claim 1, wherein the light emitting diode includes an organic light emitting diode or an electronic ink.

19. The display device according to claim 1, wherein at least one of the upper substrate and the lower substrate is made of a transparent and flexible polymer material.

20. The display device according to claim 4, wherein at least two corner areas are chamfered in an L shape.

* * * * *